(12) United States Patent
Takahashi et al.

(10) Patent No.: US 11,714,138 B2
(45) Date of Patent: Aug. 1, 2023

(54) SEMICONDUCTOR DEVICE, POWER STORAGE DEVICE, AND ELECTRONIC DEVICE

(71) Applicant: Semiconductor Energy Laboratory Co., Ltd., Kanagawa-ken (JP)

(72) Inventors: Kei Takahashi, Kanagawa (JP); Yuki Okamoto, Kanagawa (JP); Minato Ito, Kanagawa (JP); Takahiko Ishizu, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 126 days.

(21) Appl. No.: 17/294,780

(22) PCT Filed: Nov. 12, 2019

(86) PCT No.: PCT/IB2019/059681
§ 371 (c)(1),
(2) Date: May 18, 2021

(87) PCT Pub. No.: WO2020/104891
PCT Pub. Date: May 28, 2020

(65) Prior Publication Data
US 2022/0011375 A1    Jan. 13, 2022

(30) Foreign Application Priority Data
Nov. 22, 2018  (JP) .................................. 2018-219250

(51) Int. Cl.
*H02J 7/00* (2006.01)
*G01R 31/396* (2019.01)
*H01M 10/48* (2006.01)

(52) U.S. Cl.
CPC .......... *G01R 31/396* (2019.01); *H01M 10/48* (2013.01); *H02J 7/0042* (2013.01); *H02J 7/00712* (2020.01)

(58) Field of Classification Search
CPC .... G01R 21/396; H02J 7/00721; H02J 7/0042
See application file for complete search history.

(56) References Cited

U.S. PATENT DOCUMENTS 5,900,717 A    5/1999 Lee
5,909,101 A    6/1999 Matsumoto et al.
(Continued)

FOREIGN PATENT DOCUMENTS

CN    101103509 A    1/2008
CN    103323726 A    9/2013
(Continued)

OTHER PUBLICATIONS

International Search Report (Application No. PCT/IB2019/059681) dated Feb. 25, 2020.
(Continued)

*Primary Examiner* — Robert Grant
(74) *Attorney, Agent, or Firm* — Husch Blackwell LLP

(57) ABSTRACT

A semiconductor device that tests and/or monitors each of batteries provided in an assembled battery is provided. The semiconductor device includes a hysteresis comparator and a circuit, and the circuit has a function of setting a high-level side threshold voltage and a low-level side voltage of the hysteresis comparator. The circuit includes first and second capacitors. A first terminal of the first capacitor is electrically connected to a high-level side reference potential input terminal of the hysteresis comparator and a first terminal of the second capacitor is electrically connected to a low-level side reference potential input terminal of the hysteresis comparator. After a first reference potential is input to the
(Continued)

high-level side reference potential input terminal and a second reference potential is input to the low-level side reference potential input terminal, a negative electrode of a cell is electrically connected to each second terminal of the first and second capacitors, whereby the potential of each first terminal of the first and second capacitors is changed.

8 Claims, 15 Drawing Sheets

(56) References Cited

U.S. PATENT DOCUMENTS

| | | | |
|---|---|---|---|
| 6,163,190 | A | 12/2000 | Takai et al. |
| 6,340,880 | B1 | 1/2002 | Higashijima et al. |
| 6,388,424 | B1 | 5/2002 | Hidaka et al. |
| 6,429,709 | B1 * | 8/2002 | Hall ................. H02M 3/33523 327/427 |
| 7,626,315 | B2 | 12/2009 | Nagase |
| 7,952,330 | B2 | 5/2011 | Mori |
| 8,305,041 | B2 | 11/2012 | Takeda et al. |
| 9,276,398 | B2 | 3/2016 | Oshima et al. |
| 9,614,258 | B2 | 4/2017 | Takahashi et al. |
| 10,090,022 | B2 | 10/2018 | Shionoiri et al. |
| 10,298,043 | B2 | 5/2019 | Takahashi et al. |
| 11,362,647 | B2 | 6/2022 | Okamoto et al. |
| 2006/0279592 | A1 | 12/2006 | Nagase |
| 2008/0116851 | A1 | 5/2008 | Mori |
| 2010/0176768 | A1 | 7/2010 | Kimura et al. |
| 2011/0101918 | A1 | 5/2011 | Tsukamoto et al. |
| 2013/0242446 | A1 | 9/2013 | Oshima et al. |
| 2014/0021904 | A1 | 1/2014 | Takahashi et al. |
| 2021/0157392 | A1 | 5/2021 | Tramoni et al. |
| 2021/0242690 | A1 | 8/2021 | Okamoto et al. |
| 2021/0384751 | A1 | 12/2021 | Takahashi et al. |
| 2022/0006309 | A1 | 1/2022 | Takahashi et al. |
| 2022/0045370 | A1 | 2/2022 | Matsuzaki et al. |
| 2022/0052535 | A1 | 2/2022 | Yamazaki et al. |

FOREIGN PATENT DOCUMENTS

| | | |
|---|---|---|
| DE | 10 2006 000 288 A1 | 12/2006 |
| JP | 2001-145271 A | 5/2001 |
| JP | 2002-186191 A | 6/2002 |
| JP | 2006-345665 A | 12/2006 |
| JP | 2009-152129 A | 7/2009 |
| JP | 2012-208120 A | 10/2012 |
| JP | 2015-070527 A | 4/2015 |
| JP | 2015-094400 A | 5/2015 |
| KR | 2013-0106312 A | 9/2013 |
| TW | 201339608 | 10/2013 |
| WO | WO 2006/112501 A1 | 10/2006 |

OTHER PUBLICATIONS

Written Opinion (Application No. PCT/IB2019/059681) dated Feb. 25, 2020.

\* cited by examiner

SEMICONDUCTOR DEVICE, POWER STORAGE DEVICE, AND ELECTRONIC DEVICE

This application is a 371 of international application PCT/IB2019/059681 filed on Nov. 12, 2019 which is incorporated herein by reference.

TECHNICAL FIELD

One embodiment of the present invention relates to a semiconductor device, a power storage device, and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In general, when a secondary battery provided in an electric vehicle or an electronic device such as a laptop personal computer is charged and discharged repeatedly, a degradation phenomenon such as a reduction in capacity or an increase in internal resistance occurs in the secondary battery. In addition, an initial malfunction or rough handling of the battery may result in an unexpected accident such as ignition of the battery.

In recent years, more and more batteries have been provided with a circuit for testing and/or monitoring the battery or a protection circuit, in terms of safety. Patent Document 1 discloses an invention of a battery pack provided with a circuit that performs highly accurate temperature protection of the battery and performs appropriate charge control.

REFERENCE

Patent Document

[Patent Document 1] Japanese Published Patent Application No. 2009-152129

SUMMARY OF THE INVENTION

Problems to be Solved by the Invention

Some electronic devices have a structure in which a plurality of batteries (each battery is sometimes referred to as a cell) are electrically connected in series (the structure in which a plurality of batteries are connected is sometimes referred to as an assembled cell, an assembled battery, or a power source); in the case of such a structure, each of the plurality of batteries needs to be tested and/or monitored.

An object of one embodiment of the present invention is to provide a semiconductor device that tests and/or monitors each of batteries provided in an assembled battery. Another object of one embodiment of the present invention is to provide a novel power storage device including the semiconductor device. Another object of one embodiment of the present invention is to provide a novel electronic device including the power storage device.

Note that the objects of one embodiment of the present invention are not limited to the objects listed above. The objects listed above do not preclude the existence of other objects. Note that the other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a semiconductor device including a circuit and a hysteresis comparator. The circuit includes a first input terminal, the hysteresis comparator includes a first reference potential input terminal and a second reference potential input terminal, and the circuit has a function of changing a first reference potential of the first reference potential input terminal and a second reference potential of the second reference potential input terminal in accordance with a first potential input to the first input terminal.

(2)

Another embodiment of the present invention is a power storage device including the semiconductor device in (1) described above and a cell. The circuit includes a second input terminal, the cell has a function of charging electricity, a positive electrode terminal of the cell is electrically connected to the second input terminal, a negative electrode terminal of the cell is electrically connected to the first input terminal, the circuit has a function of generating a third potential corresponding to the first potential of a negative electrode of the cell that is input to the first input terminal and a second potential of a positive electrode of the cell that is input to the second input terminal, and the third potential is input to an input terminal of the hysteresis comparator.

(3)

Another embodiment of the present invention is the power storage device with the structure of (2) described above, in which the circuit includes a first switch to a sixth switch, a first resistor, a second resistor, a first capacitor, a second capacitor, and the second input terminal; a first terminal of the first resistor is electrically connected to a first terminal of the second resistor and the input terminal of the hysteresis comparator; a first terminal of the first switch is electrically connected to a first terminal of the first capacitor and the first reference potential input terminal; a first terminal of the second switch is electrically connected to a second terminal of the first capacitor; a first terminal of the third switch is electrically connected to the second terminal of the first capacitor; a first terminal of the fourth switch is electrically connected to a first terminal of the second capacitor and the second reference potential input terminal; a first terminal of the fifth switch is electrically connected to a second terminal of the second capacitor; a first terminal of the sixth switch is electrically connected to the second terminal of the second capacitor; the first input terminal is electrically connected to a second terminal of the third switch and a second terminal of the sixth switch; the second input terminal is electrically connected to a second terminal of the first resistor; and the circuit has a function of retaining the first reference potential in the first terminal of the first capacitor, a function of retaining the second reference potential in the first terminal of the second capacitor, and a function of changing the first reference potential retained in the first terminal of the first capacitor and the second reference potential retained in the first terminal of the second capacitor owing to capacitive coupling by input of the first potential to the first input terminal at the time when the first switch, the second switch, the fourth switch, and the fifth switch are each in an off state and the third switch and the sixth switch are each in an on state.

(4)

Another embodiment of the present invention is the power storage device with the structure of (3) described above, in which at least one of the first switch to the sixth switch includes a transistor, and the transistor includes a metal oxide in a channel formation region.

(5)

Another embodiment of the present invention is a power storage device including a circuit and a cell, in which the circuit includes a first input terminal, a second input terminal, a first potential retention portion, and a second potential retention portion; the cell has a function of charging electricity; a negative electrode terminal of the cell is electrically connected to the first input terminal, a positive electrode terminal of the cell is electrically connected to the second input terminal; and the circuit has a function of retaining a first reference potential in the first potential retention portion, a function of retaining a second reference potential in the second potential retention portion, and a function of changing the first reference potential of the first potential retention portion and the second reference potential of the second potential retention portion, in accordance with a first potential of the negative electrode terminal of the cell that is input to the first input terminal.

(6)

Another embodiment of the present invention is the power storage device with the structure of (5) described above, in which the circuit includes a first switch to a sixth switch, a first resistor, a second resistor, a first capacitor, and a second capacitor; a first terminal of the first resistor is electrically connected to a first terminal of the second resistor; the first potential retention portion is electrically connected to a first terminal of the first switch and a first terminal of the first capacitor; a first terminal of the second switch is electrically connected to a second terminal of the first capacitor; a first terminal of the third switch is electrically connected to the second terminal of the first capacitor; the second potential retention portion is electrically connected to a first terminal of the fourth switch and a first terminal of the second capacitor; a first terminal of the fifth switch is electrically connected to a second terminal of the second capacitor; a first terminal of the sixth switch is electrically connected to the second terminal of the second capacitor; the first input terminal is electrically connected to a second terminal of the third switch and a second terminal of the sixth switch; the second input terminal is electrically connected to a second terminal of the first resistor; and the circuit has a function of changing the first reference potential retained in the first potential retention portion and the second reference potential retained in the second potential retention portion owing to capacitive coupling by input of the first potential to the first input terminal at the time when the first switch, the second switch, the fourth switch, and the fifth switch are each in an off state and the third switch and the sixth switch are each in an on state.

(7)

Another embodiment of the present invention is the power storage device with the structure of (6) described above, in which at least one of the first switch to the sixth switch includes a transistor, and the transistor includes a metal oxide in a channel formation region.

(8)

Another embodiment of the present invention is an electronic device including the power storage device with any one of the above structures (2) to (7) and a housing.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to determine whether a current flows or not.

For example, in the case where X and Y are functionally connected, at least one circuit that enables functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween). That is, the explicit expression "X and Y are electrically connected" is the same as the explicit simple expression "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples, and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a "resistor" can be, for example, a circuit element or a wiring having a resistance value. Therefore, in this specification and the like, a "resistor" sometimes includes a wiring having a resistance value, a transistor in which current flows between the source and the drain, a diode, and a coil. Thus, the term "resistor" can be replaced with the terms "resistance", "load", and the like; inversely, the terms "resistance" and "load" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1 \times 10^9 \Omega$.

In this specification and the like, a "capacitor" refers to a circuit element with a capacitance value, gate capacitance of a transistor, parasitic capacitance, or the like. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The term "capacitor" can be replaced with the term "capacitance" and the like; inversely, the term "capacitance" can be replaced with the term "capacitor", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 µF, for example.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" are interchangeable in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be expressed as the "potential". The ground potential does not necessarily mean 0 V. Potentials are relative values, and the potential applied to a wiring or the like is sometimes changed depending on the reference potential.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a positive carrier moves, and the amount of current is expressed as a positive value. In other words, the direction in which a negative carrier moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over" and "under", are sometimes used for convenience to describe the positional relation between components with reference to drawings. The positional relation between components is changed as appropriate in accordance with a direction in which the components are described. Thus, terms for the description are not limited to terms used in the specification and the like, and the description can be made appropriately according to circumstances. For example, the expression "an insulator positioned over (on) a top surface of a conductor" can be replaced with the expression "an insulator positioned on a bottom surface of a conductor" when the direction of a drawing showing these components is rotated by 180°.

Furthermore, the term "over" or "under" does not necessarily mean that a component is placed directly on or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, a term such as an "electrode", a "wiring", or a "terminal" does not limit the function of a component. For example, an "electrode" is used as part of a "wiring" in some cases, and vice versa. Furthermore, the term "electrode" or "wiring" can also mean the case where a plurality of "electrodes" or "wirings" are formed in an integrated manner. For example, a "terminal" is used as part of a "wiring" or an "electrode" in some cases, and vice versa. Furthermore, the term "terminal" can also mean the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode".

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch is in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected.

Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where the angle formed between two straight lines is greater than or equal to −10° and less than or equal to 10°. Thus, the case where the angle is greater than or equal to −5° and less than or equal to 5° is also included. In addition, the term "approximately parallel" or "substantially parallel" indicates a state where two straight lines are placed at an angle greater than or equal to −30° and less than or equal to 30°. Moreover, "perpendicular" indicates a state where two straight lines are placed at an angle of greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a semiconductor device that tests and/or monitors each of batteries provided in an assembled battery can be provided. According to one embodiment of the present invention, a novel power storage device including the semiconductor device can be provided. According to one embodiment of the present invention, a novel electronic device including the power storage device can be provided.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

MODE FOR CARRYING OUT THE INVENTION

Figure 1:
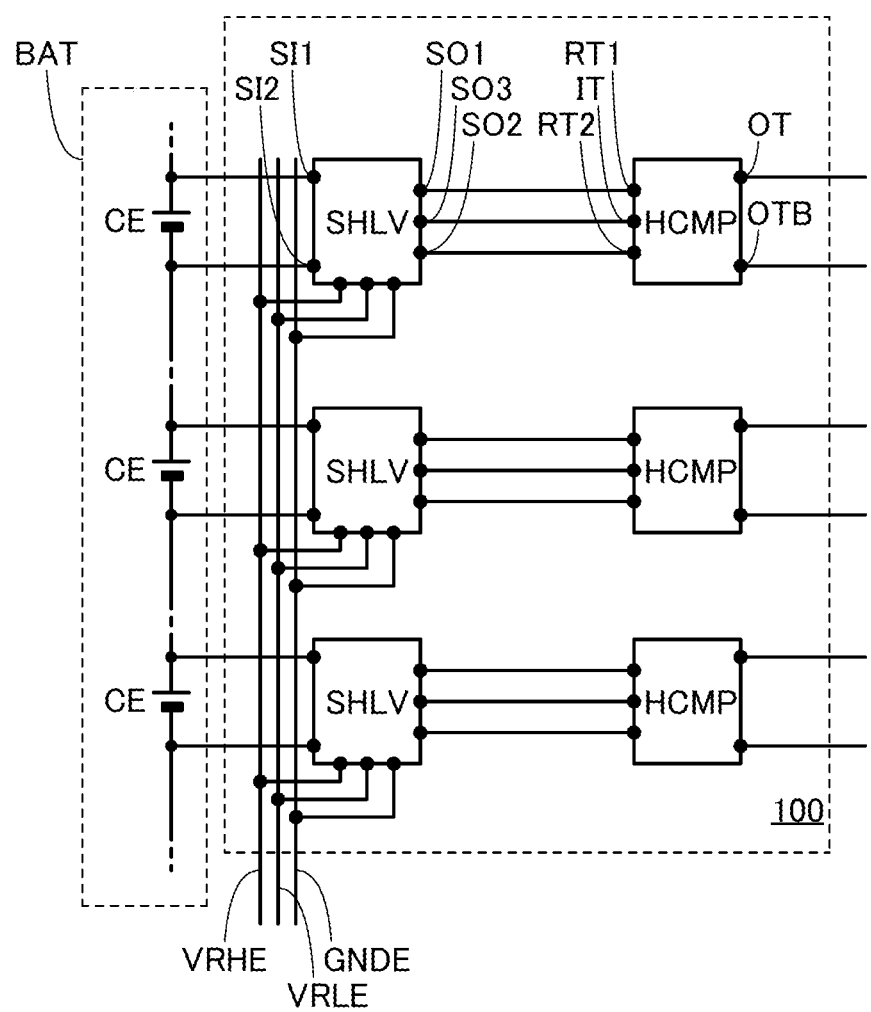
FIG. 1 is a block diagram illustrating an example of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference signs, and in particular need to be distinguished from each other, an identification numeral such as "_1", "[n]", or "[m,n]" is sometimes added to the reference signs.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, variation in signal, voltage, or current due to noise, variation in signal, voltage, or current due to difference in timing, or the like can be included.

Embodiment 1

In this embodiment, a semiconductor device that detects overcharge or overdischarge when it occurs in one of a plurality of batteries (cells) connected in series in an assembled battery and sends a detection signal will be described.

In the case where the number of the cells is one, a hysteresis comparator is used to detect overcharge or overdischarge of the cell.

In the case where overcharge of the cell is detected by a hysteresis comparator, a state in which the voltage of the cell is higher than a voltage V1 is regarded as an overcharge state, the voltage V1 is set as a high-level side threshold voltage (referred to as a high-level reference potential in some cases) of the hysteresis comparator, and a desired voltage V2 is set as a low-level side threshold voltage (referred to as a low-level reference potential in some cases) of the hysteresis comparator. At this time, when the voltage V1 is 4.35 V, the voltage V2 can be 4.0 V, preferably 4.1 V, for example. Here, when the voltage V1 is 4.35 V, the voltage V2 is 4.1 V, and the cell has an overcharge voltage exceeding 4.35 V, the output potential of the hysteresis comparator is changed from a high-level potential to a low-level potential (or from a low-level potential to a high-level potential). The cell can be detected as being in an overcharge state when the change of the output potential (hereinafter, referred to as a detection signal in some cases) is detected by a control circuit or the like separately provided, so that charge of the cell can be stopped. After that, when the cell is discharged and the voltage of the cell becomes below 4.1 V, the output potential of the hysteresis comparator is changed from a low-level potential to a high-level potential (or from a high-level potential to a low-level potential). When the voltage of the cell is lower than 4.1 V, the cell is not in an overcharge state; therefore, charge becomes possible. In other words, the cell can be detected as being in a rechargeable state when the change of the output potential is detected by the control circuit or the like separately provided, and charge of the cell can be performed.

In the case where overdischarge of the cell is detected by the hysteresis comparator, a state in which the voltage of the cell is lower than the voltage V2 is regarded as an overdischarge state, the voltage V2 is set as the low-level side threshold voltage of the hysteresis comparator, and a desired voltage V1 is set as the high-level side threshold voltage of the hysteresis comparator. At this time, when the voltage V2 is 2.5V, the voltage V1 can be 3.2 V, preferably 3.0 V, for example. Here, when the voltage V1 is 3.0 V, the voltage V2 is 2.5 V, and the cell has an overdischarge voltage below 2.5 V, the output potential of the hysteresis comparator is changed from a high-level potential to a low-level potential (or from a low-level potential to a high-level potential). The cell can be detected as being in an overdischarge state when the change of the output potential (hereinafter, referred to as a detection signal in some cases) is detected by a control circuit or the like separately provided, so that discharge of the cell can be stopped. After that, when the cell is charged and the voltage of the cell becomes higher than 3.0 V, the output potential of the hysteresis comparator is changed from a low-level potential to a high-level potential (or from a high-level potential to a low-level potential). When the voltage of the cell is higher than 3.0 V, the cell is not in an overdischarge state; therefore, discharge becomes possible. In other words, the cell can be detected as being in a dischargeable state when the change of the output potential is detected by the control circuit or the like separately provided, and discharge of the cell can be performed.

As described above, the high-level side threshold voltage and the low-level side threshold voltage of the hysteresis comparator are set for one cell and a detection signal output from an output terminal of the hysteresis comparator is obtained, whereby it is possible to know whether or not overcharge or overdischarge occurs in the cell. Note that it is preferable that the high-level side threshold voltage and the low-level side threshold voltage of the hysteresis comparator be set in accordance with either an overcharge state or an overdischarge state, whichever is desired to be detected, as described above.

In the case of an assembled battery in which a plurality of cells are connected in series, the potentials of a positive electrode and a negative electrode differ between the cells; therefore, it is necessary that the high-level side threshold voltage and the low-level side threshold voltage of the hysteresis comparator electrically connected need to be set for each cell.

One embodiment of the present invention has been made in view of the above; in an assembled battery, each of a plurality of cells is provided with a hysteresis comparator and a circuit that sets a high-level side threshold voltage and a low-level side voltage of the hysteresis comparator, which differ between the cells.

Structure Example

FIG. 1 illustrates an example of a semiconductor device of one embodiment of the present invention. A semiconductor device 100 includes a plurality of circuits SHLV and a plurality of hysteresis comparators HCMP. The semiconductor device 100 has a function of detecting overcharge or overdischarge in each of a plurality of cells CE included in an assembled battery BAT.

The plurality of cells CE are electrically connected in series in the assembled battery BAT.

The number of the circuits SHLV can be the same as the number of the cells CE included in the assembled battery BAT, for example. The number of the hysteresis comparators HCMP can be the same as the number of the cells CE included in the assembled battery BAT, for example.

The circuit SHLV includes an input terminal SI1, an input terminal SI2, and an output terminal SO1 to an output terminal SO3. The hysteresis comparator HCMP includes an input terminal IT, a reference potential input terminal RT1, a reference potential input terminal RT2, an output terminal OT, and an output terminal OTB.

In each of the plurality of cells CE, a positive electrode terminal of the cell CE is electrically connected to the input terminal SI1 of the circuit SHLV, and a negative electrode terminal of the cell CE is electrically connected to the input terminal SI2 of the circuit SHLV.

In the plurality of circuits SHLV, the output terminals SO1 of the circuits SHLV are electrically connected to the reference potential input terminals RT1 of the hysteresis comparators HCMP, the output terminals SO2 of the circuits SHLV are electrically connected to the reference potential input terminals RT2 of the hysteresis comparators HCMP, and the output terminals SO3 of the circuits SHLV are electrically connected to the input terminals IT of the hysteresis comparators HCMP.

The circuit SHLV has a function of obtaining the voltage of the cell CE from the input terminal SI1 and the input terminal SI2 and outputting a potential corresponding to the voltage to the output terminal SO3 and a function of setting the high-level side threshold voltage and the low-level side threshold voltage of the hysteresis comparator in accordance with the potential of the negative electrode terminal of the cell CE and outputting each of them to the output terminal SO1 and the output terminal SO2.

The hysteresis comparator HCMP has a function of setting a potential input to the reference potential input terminal RT1 as the high-level side threshold voltage, setting a potential input to the reference potential input terminal RT2 as the low-level side threshold voltage, comparing a voltage input to the input terminal IT with the high-level side threshold voltage and the low-level side threshold voltage, and outputting the comparison result to the output terminal OT and the output terminal OTB In particular, the output terminal OT and the output terminal OTB of the hysteresis comparator HCMP function as terminals for outputting an anomaly detection signal when the semiconductor device 100 detects overcharge or overdischarge in the cell CE.

The circuit SHLV is electrically connected to a wiring VRHE, a wiring VRLE, and a wiring GNDE. For example, the wiring VRHE, the wiring VRLE, and the wiring GNDE each function as a wiring for supplying a constant voltage. Note that a specific voltage will be described later.

Figure 2:
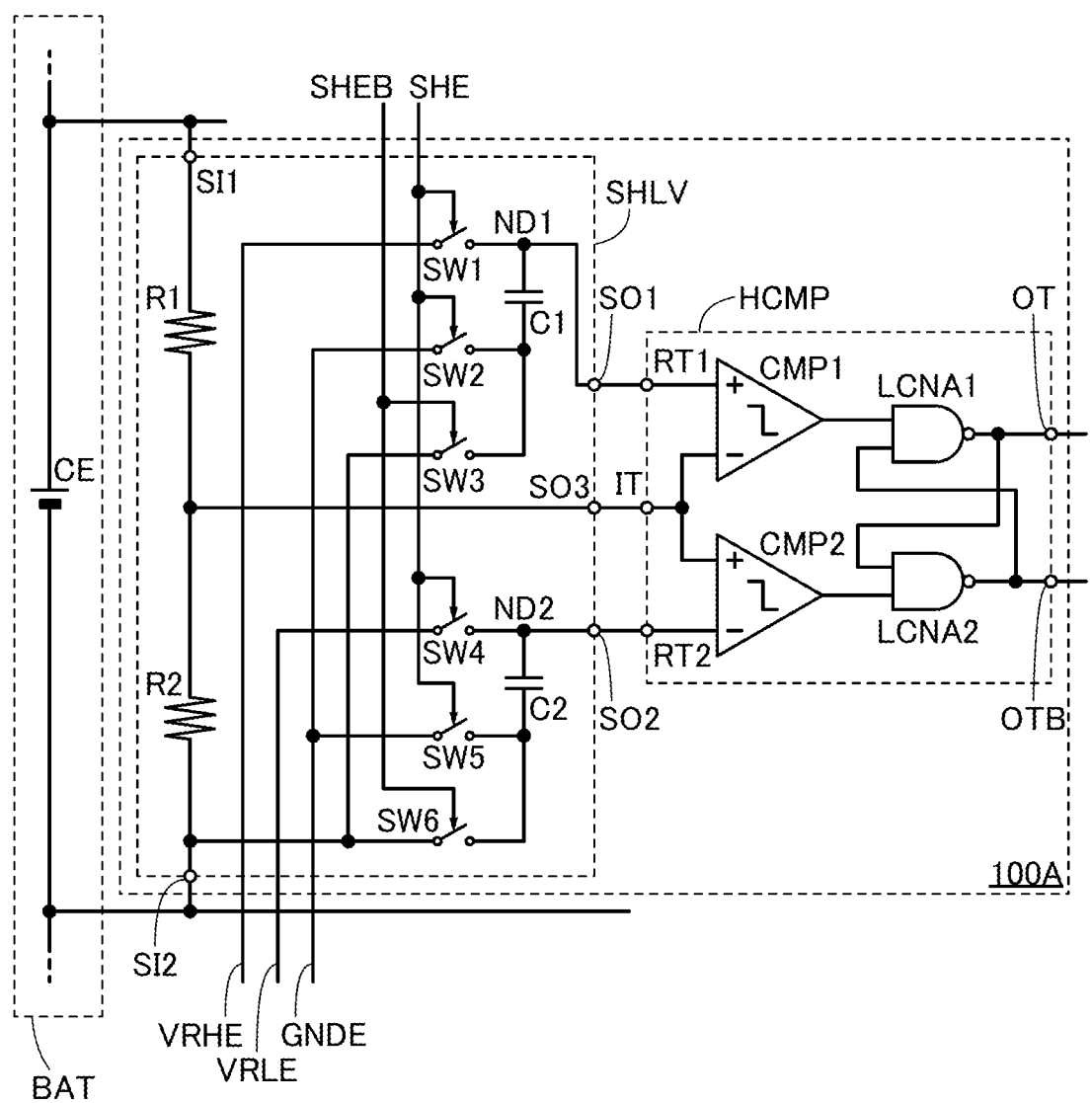
FIG. 2 is a circuit diagram illustrating an example of a semiconductor device.

FIG. 2 illustrates a specific example of the semiconductor device 100 in FIG. 1. FIG. 2 illustrates specific structure examples of the circuit SHLV and the hysteresis comparator HCMP as part of the semiconductor device 100.

In a semiconductor device 100A, the hysteresis comparator HCMP includes a comparator CMP1, a comparator CMP2, a NAND circuit LCNA1, and a NAND circuit LCNA2.

A positive-side terminal of the comparator CMP1 is electrically connected to the reference potential input terminal RT1, a negative-side terminal of the comparator CMP1 is electrically connected to the input terminal IT, and an output terminal of the comparator CMP1 is electrically connected to a first input terminal of the NAND circuit LCNA1. A positive-side terminal of the comparator CMP2 is electrically connected to the input terminal IT, a negative-side terminal of the comparator CMP2 is electrically connected to the reference potential input terminal RT2, and an output terminal of the comparator CMP2 is electrically connected to a first input terminal of the NAND circuit LCNA2. A second input terminal of the NAND circuit LCNA1 is electrically connected to an output terminal of the NAND circuit LCNA2 and the output terminal OTB. A second input terminal of the NAND circuit LCNA2 is electrically connected to an output terminal of the NAND circuit LCNA1 and the output terminal OT.

As described above, the hysteresis comparator HCMP has a function of setting the potentials input to the reference potential input terminal RT1 and the reference potential input terminal RT2 as the high-level side threshold voltage and the low-level side threshold voltage, respectively, comparing the potential input to the input terminal IT with these threshold voltages, and outputting a potential corresponding to the comparison result from the output terminal OT and the output terminal OTB. Specifically, for example, when a first potential is input to the reference potential input terminal RT1 and a second potential is input to the reference potential input terminal RT2, a potential higher than the first potential (hereinafter referred to as $V_H$) is input to the input terminal IT, whereby a high-level potential is output from the output terminal OT. At this time, for example, when the potential $V_H$ input to the input terminal IT is gradually lowered to a potential lower than the second potential (hereinafter referred to as $V_L$) and the potential of the input terminal IT becomes mostly lower than the second potential, a low-level potential is output from the output terminal OT. At this time, for example, when the potential $V_L$ input to the input terminal IT is gradually increased to the potential $V_H$ and the potential of the input terminal IT becomes mostly higher than the first potential, a high-level potential is output from the output terminal OT. Note that an inverted signal of a signal output from the output terminal OT is output to the output terminal OTB.

Note that the hysteresis comparator HCMP may be formed as a CMOS (Complementary MOS) circuit or may be formed as a single-polarity circuit (a circuit formed of only transistors having the same polarity).

In the semiconductor device 100A, the circuit SHLV includes a switch SW1 to a switch SW6, a resistor R1, a resistor R2, a capacitor C1, and a capacitor C2.

Note that in this specification and the like, each of the switch SW1 to the switch SW6 is turned on when a high-level potential is applied to its control terminal and is turned off when a low-level potential is applied to the control terminal.

The resistor R1 and the resistor R2 are circuit elements for dividing the voltage of the cell CE. Therefore, for dividing the voltage of the cell CE, a circuit element other than the resistor R1 and the resistor R2 can be used in some cases. For example, a diode may be used instead of the resistor R1 and the resistor R2 in some cases.

A first terminal of the switch SW1 is electrically connected to the wiring VRHE, and a second terminal of the switch SW1 is electrically connected to a first terminal of the capacitor C1 and the output terminal SO1. A first terminal of the switch SW2 is electrically connected to the wiring GNDE, and a second terminal of the switch SW2 is electrically connected to a second terminal of the capacitor C1 and a first terminal of the switch SW3. A first terminal of the switch SW4 is electrically connected to the wiring VRLE, and a second terminal of the switch SW4 is electrically connected to a first terminal of the capacitor C2 and the output terminal SO2. A first terminal of the switch SW5 is electrically connected to the wiring GNDE, and a second terminal of the switch SW5 is electrically connected to a second terminal of the capacitor C2 and a first terminal of the switch SW6. A second terminal of the switch SW3 and a second terminal of the switch SW6 are electrically connected to the input terminal SI2. Each control terminal of the switch SW1, the switch SW2, the switch SW4, and the switch SW5 is electrically connected to a wiring SHE, and each control terminal of the switch SW3 and the switch SW6 is electrically connected to a wiring SHEB.

Note that in FIG. 2, an electrical connection point between the second terminal of the switch SW1 and the first terminal of the capacitor C1 is denoted by a node ND1, and an electrical connection point between the second terminal of the switch SW4 and the first terminal of the capacitor C2 is denoted by a node ND2. Since the node ND1 and the node ND2 are electrically connected to the first terminal of the capacitor C1 and the first terminal of the capacitor C2, respectively, and therefore, they may be referred to as potential retention portions. Note that the capacitance values of the capacitor C1 and the capacitor C2 may be higher than or equal to 0.01 fF and lower than or equal to 100 pF, preferably higher than or equal to 0.05 fF and lower than or equal to 10 pF, still further preferably higher than or equal to 0.1 fF and lower than or equal to 1 pF.

A first terminal of the resistor R1 is electrically connected to the input terminal SI1, a second terminal of the resistor R1 is electrically connected to the output terminal SO3 and a first terminal of the resistor R2, and a second terminal of the resistor R2 is electrically connected to the input terminal SI2.

For example, the wiring VRHE, the wiring VRLE, and the wiring GNDE each function as a wiring for supplying a constant voltage. In particular, a constant voltage supplied by the wiring VRHE can be, for example, the high-level side threshold voltage input to the reference potential input terminal RT1 of the hysteresis comparator HCMP, and a constant voltage supplied by the wiring VRLE can be, for example, the low-level side threshold voltage input to the reference potential input terminal RT2 of the hysteresis comparator HCMP. A constant voltage supplied by the wiring GNDE can be, for example, a ground potential (GND) or a voltage lower than the ground potential. Note that it is preferable that the high-level side threshold voltage be higher than the low-level side threshold voltage and the constant voltage supplied by the wiring GNDE, and the low-level side threshold voltage be higher than the constant voltage supplied by the wiring GNDE. In addition, generation circuits may be electrically connected to the wiring VRHE, the wiring VRLE, and the wiring GNDE (not illustrated), and each of the generation circuits may generate a predetermined constant voltage.

For example, the wiring SHE functions as a wiring that supplies a constant voltage (rephrased as a signal in some cases) to the control terminals of the switch SW1, the switch SW2, the switch SW4, and the switch SW5. That is, the wiring SHE functions as a wiring that switches the on state and the off state of each of the switch SW1, the switch SW2, the switch SW4, and the switch SW5. For example, the wiring SHEB functions as a wiring that supplies a constant voltage (rephrased as a signal in some cases) to the control terminals of the switch SW3 and the switch SW6. That is, the wiring SHEB functions as a wiring that switches the on state and the off states of each of the switch SW3 and the switch SW6. Note that the signal supplied by the wiring SHEB may be an inverted signal of the signal supplied by the wiring SHE or may be a signal that does not depend on the signal supplied by the wiring SHE, for example.

Operation Example

Figure 3A:
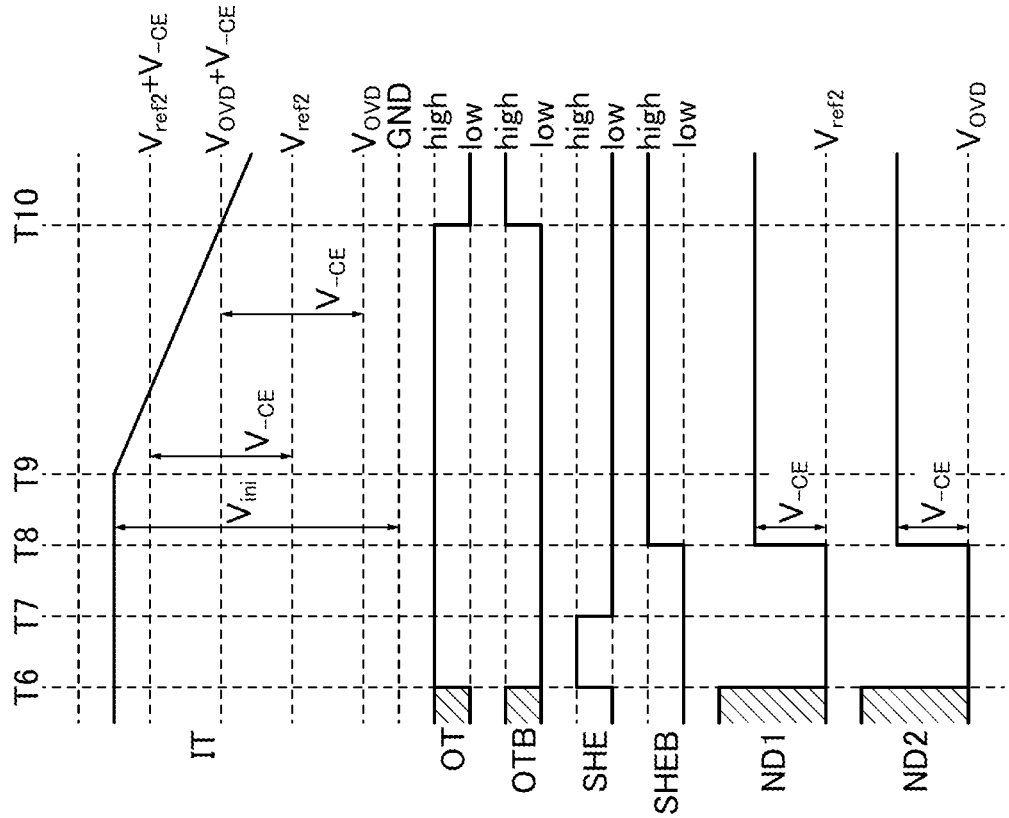
FIG. 3A and FIG. 3B are timing charts illustrating operation examples of a semiconductor device.
Figure 3B:
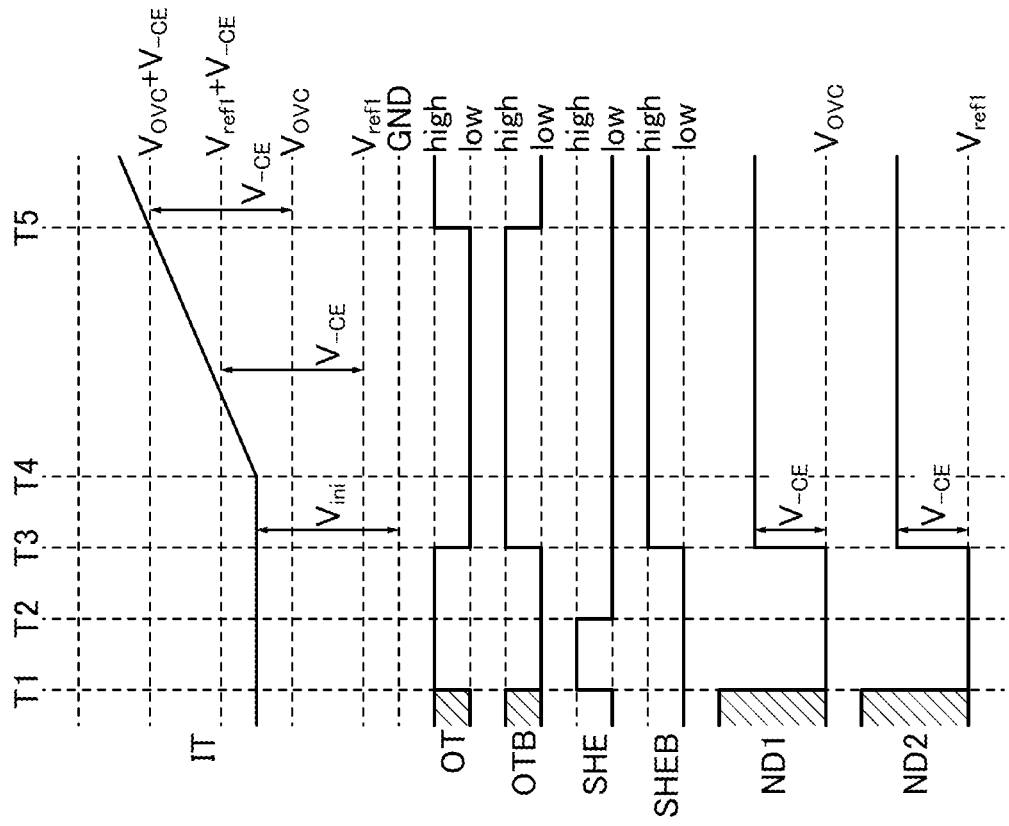

Next, an operation example of the semiconductor device 100A in FIG. 2 will be described. FIG. 3A and FIG. 3B are timing charts illustrating changes in the voltage input to the input terminal IT, the voltages output from the output terminal OT and the output terminal OTB, the potentials of the wiring SHE and the wiring SHEB, and the potentials of the node ND1 and the node ND2. Note that FIG. 3A is the timing chart in the case where the cell CE is in an overcharge state and the semiconductor device 100A outputs an anomaly detection signal, and FIG. 3B is the timing chart in the case where the cell CE is in an overdischarge state and the semiconductor device 100A outputs an anomaly detection signal. Note that in FIG. 3A and FIG. 3B, high denotes a high-level potential, and low denotes a low-level potential.

When the resistance values of the resistor R1 and the resistor R2 are $R_1$ and $R_2$, respectively, the potential of the positive electrode of the cell CE is $V_{+CE}$, and the potential of the negative electrode of the cell CE is $V_{-CE}$, a potential $V_{ini}$ that is input to the input terminal IT is $(V_{+CE}-V_{-CE}) \times R_2/(R_1+R_2)+V_{-CE}=V_{+CE} \times R_2/(R_1+R_2)+V_{-CE} \times R_1/(R_1+R_2)$. Therefore, for example, when the resistance values $R_1$ and $R_2$ are each 0.1Ω, the potential $V_{ini}$ input to the input terminal IT is $(V_{+CE}+V_{-CE})/2$; alternatively, for example, when the resistance values $R_1$ and $R_2$ are 0.1Ω and 0.2Ω, respectively, the potential $V_{ini}$ is $V_{+CE} \times 2/3 + V_{-CE}/3$.

<<Detection Operation for Overcharge>>

First, an operation example in which the semiconductor device detects overcharge and outputs a detection signal is described.

In the timing chart of FIG. 3A, a constant voltage supplied by the wiring VRHE, i.e., an overcharge voltage, is referred to as $V_{OVC}$ and a constant voltage supplied by the wiring VRLE is referred to as $V_{refl}$. A constant voltage supplied by the wiring GNDE is referred to as a ground potential (GND). In addition, $V_{OVC}$ is a voltage higher than $V_{refl}$ and GND, and $V_{refl}$ is a voltage higher than GND.

In the timing chart of FIG. 3A, before Time T1, the high-level side threshold voltage input to the reference potential input terminal RT1 and the low-level side threshold voltage input to the reference potential input terminal RT2 are indeterminate. Thus, the potentials output from the output terminal OT and the output terminal OTB become indeterminate. Therefore, in the timing chart of FIG. 3A, the potentials of the output terminal OT and the output terminal OTB and the potentials of the node ND1 and the node ND2 before Time T1 are denoted by hatching.

During a period from Time T1 to Time T2, the potential $V_{ini}$ is input to the input terminal IT. Note that the potential $V_{ini}$ is a potential higher than $V_{OVC}$ in this operation example.

In addition, during the period from Time T1 to Time T2, a high-level potential is input to the wiring SHE and a low-level potential is input to the wiring SHEB. Thus, a high-level potential is input to each control terminal of the switch SW1, the switch SW2, the switch SW4, and the switch SW5, so that the switch SW1, the switch SW2, the switch SW4, and the switch SW5 are each turned on. Furthermore, a low-level potential is input to each control terminal of the switch SW3 and the switch SW6, so that the switch SW3 and the switch SW6 are each turned off.

The switch SW1 is turned on, whereby a conduction state is established between the first terminal of the capacitor C1 (the node ND1) and the wiring VRHE, so that the potential of the first terminal of the capacitor C1 (the node ND1) becomes $V_{OVC}$. At the same time, $V_{OVC}$ is input to the reference potential input terminal RT1 of the hysteresis comparator HCMP. A conduction state is established between the second terminal of the capacitor C1 and the wiring GNDE by turning on the switch SW2, and the switch SW3 is turned off, whereby a non-conduction state is established between the second terminal of the capacitor C1 and the negative electrode of the cell CE; as a result, the potential of the second terminal of the capacitor C1 becomes GND.

The switch SW4 is turned on, whereby a conduction state is established between the first terminal of the capacitor C2 (the node ND2) and the wiring VRLE, so that the potential of the first terminal of the capacitor C2 (the node ND2) becomes $V_{refl}$. At the same time, $V_{refl}$ is input to the reference potential input terminal RT2 of the hysteresis comparator HCMP. A conduction state is established between the second terminal of the capacitor C2 and the wiring GNDE by turning on the switch SW5, and the switch SW6 is turned off, whereby a non-conduction state is established between the second terminal of the capacitor C2 and the negative electrode of the cell CE; as a result, the potential of the second terminal of the capacitor C2 becomes GND.

At this time, $V_{ini}$ is input to the input terminal of the hysteresis comparator HCMP, $V_{OVC}$ is input to the reference potential input terminal RT1, and $V_{refl}$ is input to the reference potential input terminal RT2. The hysteresis comparator HCMP compares the potential $V_{ini}$ of the input terminal with $V_{OVC}$ which is to be the high-level side threshold voltage and $V_{refl}$ which is to be the low-level side threshold voltage, and outputs potentials from the output terminal OT and the output terminal OTB in accordance with the comparison result. In this operation example, since $V_{ini}$ is a potential higher than $V_{OVC}$, a high-level potential is output from the output terminal OT and a low-level potential is output from the output terminal OTB.

During a period from Time T2 to Time T3, a low-level potential is input to the wiring SHE. Thus, a low-level potential is input to each control terminal of the switch SW1, the switch SW2, the switch SW4, and the switch SW5, so that the switch SW1, the switch SW2, the switch SW4, and the switch SW5 are each turned off.

The switch SW1 is turned off, whereby a non-conduction state is established between the node ND1 and the wiring VRHE. In addition, since no power supply potential is supplied from the inside of the hysteresis comparator HCMP to the reference potential input terminal RT1, the node ND1 is brought into an electrically floating state. Accordingly, $V_{OVC}$ which is the potential of the node ND1 is retained by the capacitor C1. Furthermore, after $V_{OVC}$ which is the potential of the node ND1 is retained, a generation circuit of $V_{OVC}$ supplied to the wiring VRHE may be stopped. This can reduce power consumption of the generation circuit of $V_{OVC}$.

The switch SW4 is turned off, whereby a non-conduction state is established between the node ND2 and the wiring VRLE. In addition, since no power supply potential is supplied from the inside of the hysteresis comparator HCMP to the reference potential input terminal RT2, the node ND2 is also brought into an electrically floating state. Accordingly, $V_{refl}$ which is the potential of the node ND2 is retained by the capacitor C2. Furthermore, after $V_{refl}$ which is the potential of the node ND2 is retained, a generation circuit of $V_{refl}$ supplied to the wiring VRLE may be stopped. This can reduce power consumption of the generation circuit of $V_{refl}$.

During a period from Time T3 to Time T4, a high-level potential is input to the wiring SHEB. Thus, a high-level potential is input to each control terminal of the switch SW3 and the switch SW6, so that the switch SW3 and the switch SW6 are each turned on.

The switch SW3 is turned on, whereby a conduction state is established between the second terminal of the capacitor C1 and the negative electrode of the cell CE; as a result, the potential of the second terminal of the capacitor C1 becomes $V_{-CE}$. At this time, since the switch SW2 is in an off state and the node ND1 is in an electrically floating state, when the potential of the second terminal of the capacitor C1 is changed from GND to $V_{-CE}$, the potential of the node ND1 is also changed owing to capacitive coupling of the capacitor C1. Note that the amount of change in potential due to capacitive coupling is determined in accordance with a capacitive coupling coefficient; however, for simple description, the potential of the node ND1 is changed to $V_{OVC}+V_{-CE}$ when the potential of the second terminal of the capacitor C1 is changed from GND to $V_{-CE}$ in this specification and the like. That is, the change in the potential corresponds to the case where a capacitive coupling coefficient that is determined in accordance with the capacitor C1 and peripheral circuit elements is 1.

The switch SW6 is turned on, whereby a conduction state is established between the second terminal of the capacitor C2 and the negative electrode of the cell CE; as a result, the potential of the second terminal of the capacitor C2 becomes $V_{-CE}$. At this time, since the switch SW5 is in an off state and the node ND2 is in an electrically floating state, when the potential of the second terminal of the capacitor C2 is changed from GND to $V_{-CE}$, the potential of the node ND2 is also changed owing to capacitive coupling of the capacitor C2. Note that in this specification and the like, when a capacitive coupling coefficient that is determined in accordance with the capacitor C2 and peripheral circuit elements is set to be 1 in the same manner as that described above and the potential of the second terminal of the capacitor C2 is changed from GND to $V_{-CE}$, the potential of the node ND2 is changed to $V_{refl}+V_{-CE}$.

At this time, $V_{OVC}+V_{-CE}$ is input to the reference potential input terminal RT1 of the hysteresis comparator HCMP, and $V_{refl}+V_{-CE}$ is input to the reference potential input terminal RT2. In other words, each of the high-level side threshold voltage and the low-level side threshold voltage of the hysteresis comparator HCMP is increased by $V_{-CE}$. Here, when $V_{ini}$ input to the input terminal IT becomes a potential lower than or equal to $V_{refl}+V_{-CE}$, a low-level potential is output from the output terminal OT and a high-level potential is output from the output terminal OTB.

After Time T4, charge of the cell CE is performed. Thus, the voltage of the cell CE, $V_{+CE}-V_{-CE}$, increases and the potential input to the input terminal IT increases gradually.

By the charge of the cell CE, $V_{+CE}$ and/or $V_{-CE}$ are/is changed in some cases. For example, in the case where $V_{-CE1}$ is changed, the potentials of the node ND1 and the node ND2 are also changed owing to capacitive coupling of the capacitor C1 and the capacitor C2; thus, the high-level side threshold voltage and the low-level side threshold voltage of the hysteresis comparator HCMP are also changed. In other words, the semiconductor device illustrated in FIG. 2 can optimally adjust the high-level side threshold voltage and the low-level side threshold voltage of the hysteresis comparator HCMP in accordance with a change in $V_{-CE}$ of the cell CE at the time of charge. Note that for simple description, $V_{-CE}$ is not changed after Time T4 in this operation example. Therefore, the potentials of the node ND1 and the node ND2 after Time T4 are always $V_{OVC}+V_{-CE}$ and $V_{ref1}+V_{-CE}$, respectively.

At Time T5, the potential of the input terminal IT reaches $V_{OVC}+V_{-CE}$. Therefore, after Time T5, the potential of the negative-side input terminal is higher than the potential of the positive-side input terminal in the comparator CMP1 included in the hysteresis comparator HCMP, so that the output terminal of the comparator CMP1 outputs a low-level potential. Accordingly, a high-level potential is output from the output terminal OT of the hysteresis comparator HCMP and a low-level potential is output from the output terminal OTB.

According to the timing chart of FIG. 3A, by overcharge of the cell CE, the detection signal output from the output terminal OT is changed from a low-level potential to a high-level potential. Therefore, with the use of the semiconductor device of FIG. 2, the change from a low-level potential to a high-level potential of the detection signal output from the output terminal OT of the hysteresis comparator HCMP is obtained at the time of charging the cell CE, whereby overcharge of the cell CE can be detected. Note that depending on the structure of the hysteresis comparator HCMP, the detection of an overcharge state of the cell CE may be performed by obtaining change from a high-level potential to a low-level potential of the detection signal output from the output terminal OT.

Note that in the timing chart of FIG. 3A, when $V_{ini}$ input to the input terminal IT is a voltage higher than $V_{ref1}+V_{-CE}$, $V_{ini}$ is not lower than the low-level side threshold voltage during the period from Time T3 to Time T4, and therefore, the output terminal OT and the output terminal OTB of the hysteresis comparator HCMP output a high-level potential and a low-level potential, respectively. At this time, since the cell CE is in an overcharge state or in a state with a moderate amount of battery power remaining, it is sometimes preferable to perform not charge but discharge. For the operation of discharge, an operation in the timing chart of FIG. 3B that is described below is referred to.

<<Detection Operation for Overdischarge>>

Next, an operation example in which the semiconductor device detects overdischarge and outputs a detection signal is described.

In the timing chart of FIG. 3B, a constant voltage supplied by the wiring VRHE is referred to as $V_{ref2}$ and a constant voltage supplied by the wiring VRLE, i.e., an overdischarge voltage, is referred to as $V_{OVD}$. A constant voltage supplied by the wiring GNDE is referred to as a ground potential (GND). In addition, $V_{OVD}$ is a voltage higher than $V_{ref2}$ and GND, and $V_{ref2}$ is a voltage higher than GND.

Operations of the semiconductor device before Time T6 and in a period from Time T6 to Time T8 in the timing chart of FIG. 3B can be similar to the operations of the semiconductor device before Time T1 and in the period from Time T1 to Time T3 in the timing chart of FIG. 3A. Therefore, for the operations of the semiconductor device in the period from Time T6 to Time T8, the description of the operations of the semiconductor device before Time T1 and in the period from Time T1 to Time T3 is referred to. Note that in the timing chart of FIG. 3B, the potential $V_{ini}$ input to the input terminal IT is a sufficiently high potential during the period from Time T6 to Time T8. Thus, a high-level potential and a low-level potential are output from the output terminal OT and the output terminal OTB of the hysteresis comparator HCMP, respectively.

During a period from Time T8 to Time T9, a high-level potential is input to the wiring SHEB. Thus, a high-level potential is input to each control terminal of the switch SW3 and the switch SW6, so that the switch SW3 and the switch SW6 are each turned on.

The switch SW3 is turned on, whereby a conduction state is established between the second terminal of the capacitor C1 and the negative electrode of the cell CE; as a result, the potential of the second terminal of the capacitor C1 becomes $V_{-CE}$. At this time, since the switch SW2 is in an off state and the node ND1 is in an electrically floating state, when the potential of the second terminal of the capacitor C1 is changed from GND to $V_{-CE}$, the potential of the node ND1 is also changed to $V_{ref2}+V_{-CE}$ owing to capacitive coupling of the capacitor C1.

The switch SW6 is turned on, whereby a conduction state is established between the second terminal of the capacitor C2 and the negative electrode of the cell CE; as a result, the potential of the second terminal of the capacitor C2 becomes $V_{-CE}$. At this time, since the switch SW5 is in an off state and the node ND2 is in an electrically floating state, when the potential of the second terminal of the capacitor C2 is changed from GND to $V_{-CE}$, the potential of the node ND2 is also changed to $V_{OVD}+V_{-CE}$ owing to capacitive coupling of the capacitor C2.

At this time, $V_{ref2}+V_{-CE}$ is input to the reference potential input terminal RT1 of the hysteresis comparator HCMP, and $V_{OVD}+V_{-CE}$ is input to the reference potential input terminal RT2. In other words, each of the high-level side threshold voltage and the low-level side threshold voltage of the hysteresis comparator HCMP is increased by $V_{-CE}$. Here, when $V_{ini}$ input to the input terminal IT is a potential higher than $V_{ref2}+V_{-CE}$, a high-level potential is output from the output terminal OT and a low-level potential is output from the output terminal OTB.

After Time T9, discharge of the cell CE is performed. Thus, the voltage of the cell CE, $V_{+CE}-V_{-CE}$, decreases, and the potential input to the input terminal IT decreases gradually.

By the discharge of the cell CE, $V_{+CE}$ and/or $V_{-CE}$ are/is changed in some cases. Note that in the case where $V_{-CE}$ is changed, the potentials of the node ND1 and the node ND2 are also changed owing to capacitive coupling of the capacitor C1 and the capacitor C2 in a manner similar to that in the operation of charging the cell CE, and the high-level side threshold voltage and the low-level side threshold voltage of the hysteresis comparator HCMP are also changed. In other words, the semiconductor device illustrated in FIG. 2 can optimally adjust the high-level side threshold voltage and the low-level side threshold voltage of the hysteresis comparator HCMP in accordance with a change in $V_{-CE}$ of the cell CE even at the time of discharge. Note that for simple description, $V_{-CE}$ is not changed after Time T9 in this operation example. Therefore, the potentials of the node ND1 and the node ND2 after Time T9 are always $V_{ref2}+V_{-CE}$ and $V_{OVD}+V_{-CE}$, respectively.

At Time T10, the potential of the input terminal IT is reduced to $V_{OVD}+V_{-CE}$. Therefore, after Time T10, the potential of the positive-side input terminal is lower than the potential of the negative-side input terminal in the comparator CMP2 included in the hysteresis comparator HCMP, so that the output terminal of the comparator CMP2 outputs a low-level potential. Accordingly, a low-level potential is output from the output terminal OT of the hysteresis comparator HCMP and a high-level potential is output from the output terminal OTB.

According to the timing chart of FIG. 3B, by overdischarge of the cell CE, the detection signal output from the output terminal OT is changed from a high-level potential to a low-level potential. Therefore, with the use of the semiconductor device of FIG. 2, the change from a high-level potential to a low-level potential of the detection signal output from the output terminal OT of the hysteresis comparator HCMP is obtained at the time of discharging the cell CE, whereby overdischarge of the cell CE can be detected. Note that depending on the structure of the hysteresis comparator HCMP, the detection of an overdischarge state of the cell CE may be performed by obtaining change from a low-level potential to a high-level potential of the detection signal output from the output terminal OT.

Note that the operation of the semiconductor device 100A of one embodiment of the present invention is not limited to the above operation example. The operation example of the semiconductor device 100A may be changed as appropriate depending on circumstances.

Other Structure Examples

One embodiment of the present invention is not limited to the semiconductor device 100A illustrated in FIG. 2. Depending on circumstances, the structure of the semiconductor device 100A may be changed.

For example, transistors can be used as the switch SW1 to the switch SW6 included in the circuit SHLV in the semiconductor device 100A in FIG. 2. A semiconductor device 100B illustrated in FIG. 4 has a structure in which the switch SW1 to the switch SW6 of the semiconductor device 100A in FIG. 2 are replaced with a transistor M1 to a transistor M6 that are n-channel transistors.

Note that some or all of the transistor M1 to the transistor M6 may be replaced with p-channel transistors. The circuit SHLV may be formed as a CMOS circuit, not a single-polarity circuit. For example, as in a semiconductor device 100C illustrated in FIG. 5, the transistor M3 and the transistor M6 of the semiconductor device 100B in FIG. 4 may be replaced with a transistor M3$p$ and a transistor M6$p$ that are p-channel transistors, respectively. Since the semiconductor device 100C does not include the wiring SHEB, the area of the circuit SHLV can be smaller than that in the semiconductor device 100A. Alternatively, for example, an analog switch may be used as each of the switch SW1 to the switch SW6 of the semiconductor device 100A (not illustrated).

Some or all of the transistor M1 to the transistor M6 and transistors included in the hysteresis comparator HCMP are preferably OS transistors. In particular, a transistor whose off-state current needs to be low, specifically, for example, a transistor having a function of retaining charge accumulated in a capacitor, is preferably an OS transistor. In particular, in the case where an OS transistor is used as the transistor, the OS transistor preferably has a structure described particularly in Embodiment 2.

For example, it is further preferable that a metal oxide included in a channel formation region of the OS transistor be an oxide containing at least one of indium, an element M (examples of the element M include aluminum, gallium, yttrium, and tin), and zinc. The off-state current per micrometer of channel width of the OS transistor including the metal oxide in the channel formation region can be lower than or equal to 10 aA ($1 \times 10^{-17}$ A), preferably lower than or equal to 1 aA ($1 \times 10^{-18}$ A), further preferably lower than or equal to 10 zA ($1 \times 10^{-20}$ A), still further preferably lower than or equal to 1 zA ($1 \times 10^{-21}$ A), yet further preferably lower than or equal to 100 yA ($1 \times 10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

In addition, some or all of the transistor M1 to the transistor M6 and the transistors included in the hysteresis comparator HCMP may be transistors including silicon in channel formation regions (hereinafter referred to as Si transistors), other than OS transistors. As silicon, single crystal silicon, hydrogenated amorphous silicon, microcrystalline silicon, or polycrystalline silicon can be used, for example. As transistors other than the OS transistor and the Si transistor, it is possible to use, for example, a transistor containing a semiconductor such as Ge in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

Note that for the metal oxides in the semiconductor layers of OS transistors, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability in some cases. For this reason, in the semiconductor device illustrated in FIG. 4, OS transistors may be used as the n-channel transistors included in the circuit SHLV, the hysteresis comparator HCMP, and the like, and Si transistors may be used as the p-channel transistors.

Figure 4:
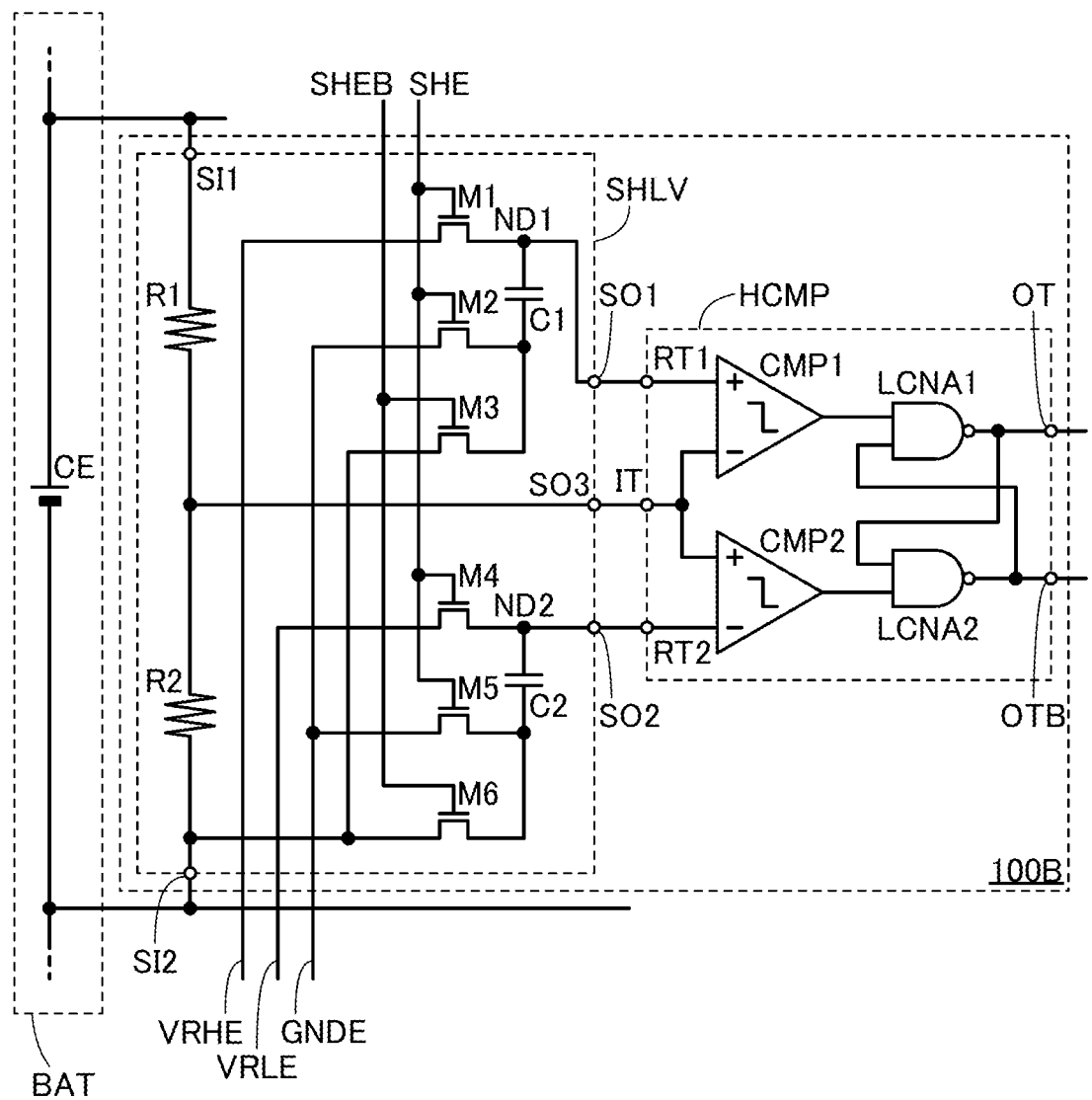
FIG. 4 is a circuit diagram illustrating an example of a semiconductor device.
Figure 5:
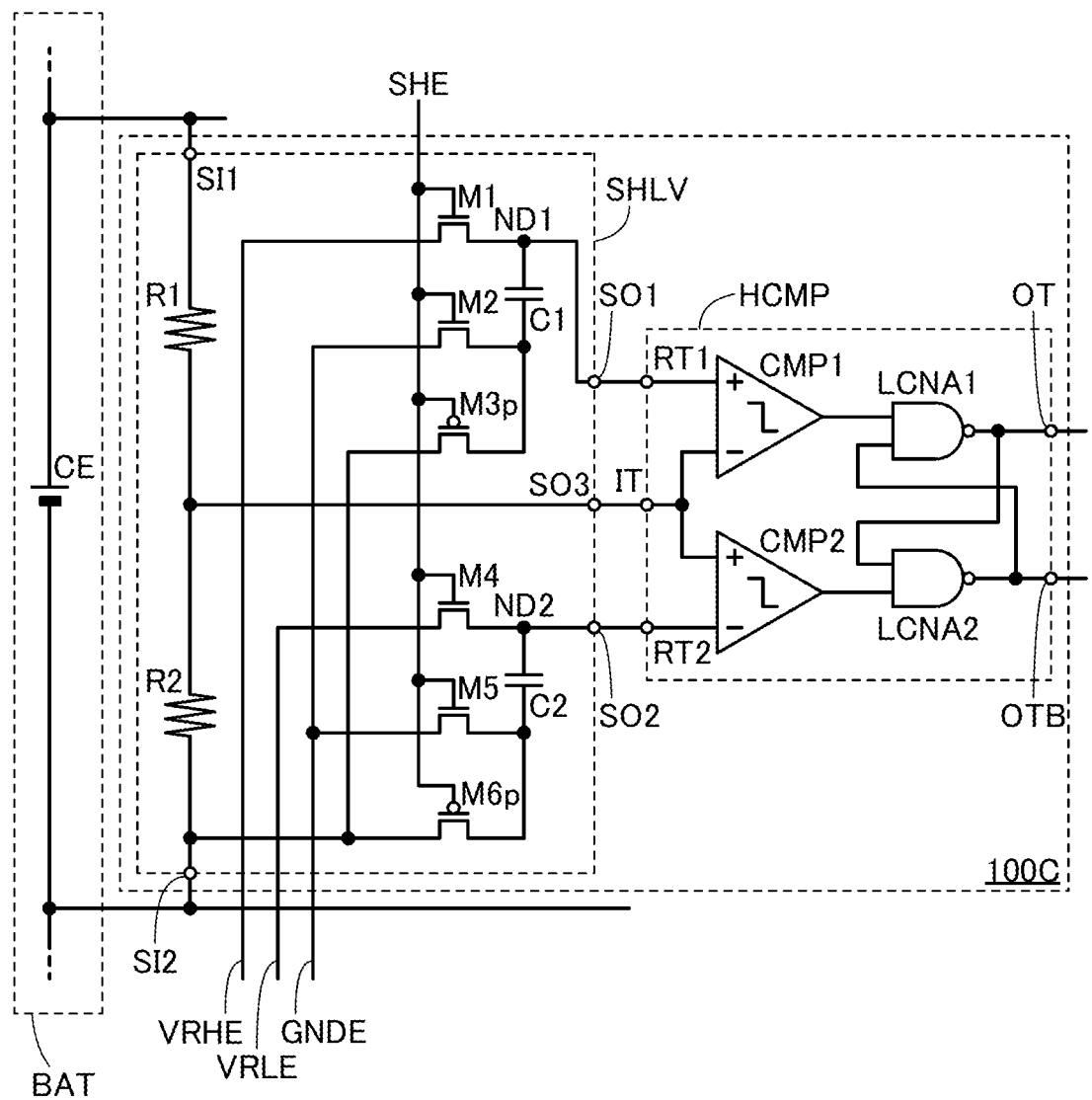
FIG. 5 is a circuit diagram illustrating an example of a semiconductor device.
Figure 6:
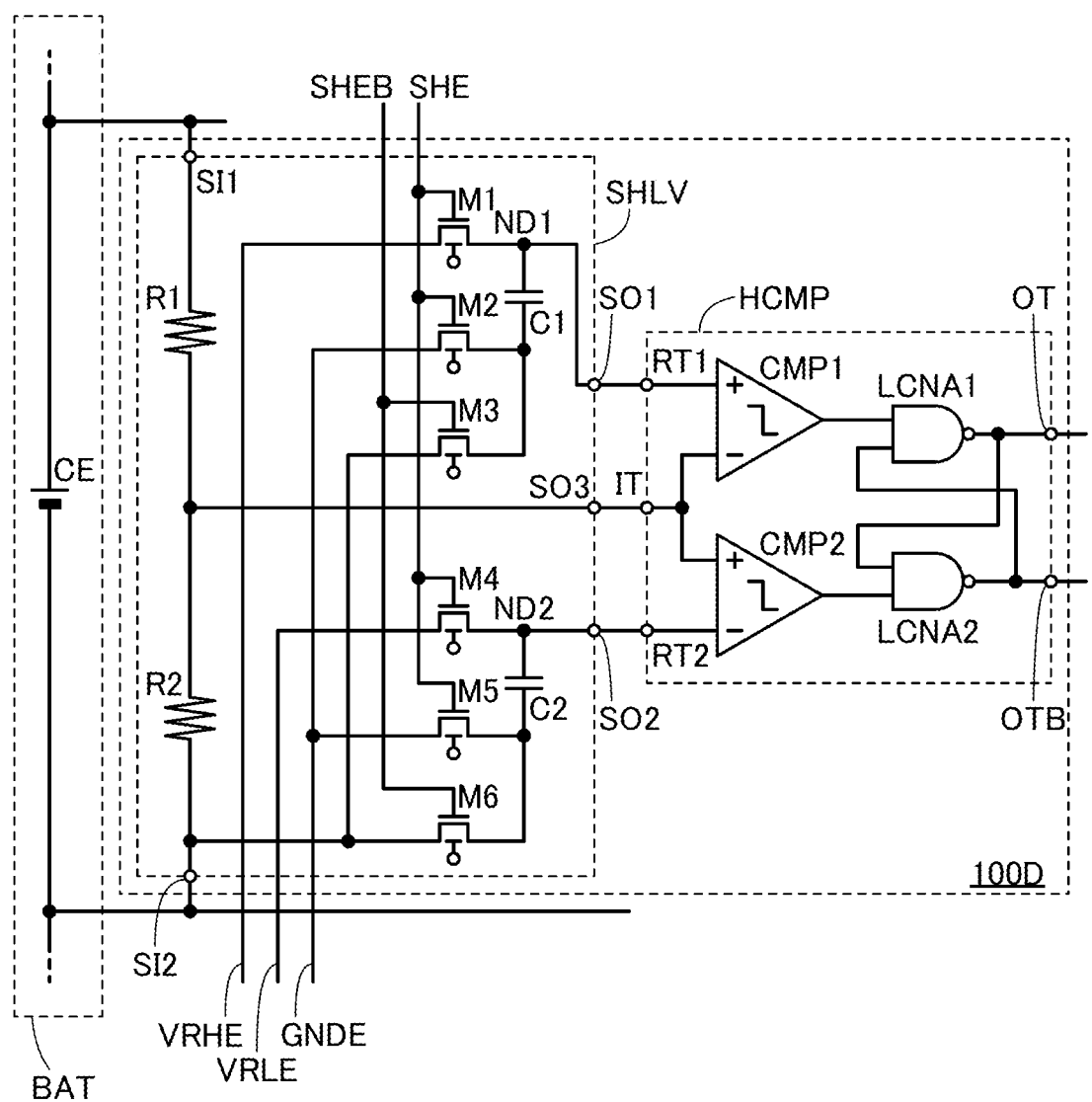
FIG. 6 is a circuit diagram illustrating an example of a semiconductor device.

The semiconductor device 100B in FIG. 4 may have a structure in which the transistor M1 to the transistor M6 included in the circuit SHLV each have a back gate, as in a semiconductor device 100D in FIG. 6. Although all of the transistor M1 to the transistor M6 have back gates in FIG. 6, only some of the transistor M1 to the transistor M6 may have back gates. In addition, the transistors included in the hysteresis comparator HCMP may have back gates.

Electrical connections between the back gates of the transistor M1 to the transistor M6 are not illustrated in FIG. 6; however, the connection destination of the back gate of the transistor can be determined depending on desired operation or characteristics of the transistor, in a stage of designing. The back gate of the transistor can be electrically connected to, for example, the gate of the transistor. When the gate and the back gate of the transistor are electrically connected to each other, the amount of current flowing through the transistor in the on state can be increased. For example, the back gate of the transistor may be provided with a wiring for electrically connecting to an external circuit and the threshold voltage may be increased by supply of a potential to the back gate of the transistor from the external circuit, so that the off-state current may be reduced. With such a structure, the off-state current of the transistor can be reduced owing to the external circuit.

In the semiconductor device 100D in FIG. 6, for example, the above-described OS transistors can be used as the transistor M1 to transistor M6 having the back gates.

Although the structure in which the transistor M1 to the transistor M6 in the semiconductor device 100D in FIG. 6 have back gates is described in this structure example, a transistor included in another structure may have a back gate. In other words, a transistor described in this specification and the like can be a transistor having a back gate.

As described above, with any one structure of the semiconductor device 100A to the semiconductor device 100D, overcharge or overdischarge can be detected in each of the plurality of cells CE that are included in the assembled battery BAT and electrically connected in series. When any one of the semiconductor device 100A to the semiconductor device 100D is used as the semiconductor device 100, constant voltages supplied by the wiring VRHE and the wiring VRLE can be shared by the cells included in the assembled battery, and the high-level side threshold voltage and the low-level side threshold voltage of the hysteresis comparator HCMP can be set in accordance with the corresponding cell.

Note that this embodiment can be combined with any of the other embodiments in this specification as appropriate.

Embodiment 2

In this embodiment, structure examples of the semiconductor device described in the above embodiment and structure examples of a transistor that can be used in the semiconductor device will be described.

Structure Examples of Semiconductor Device

Figure 7:
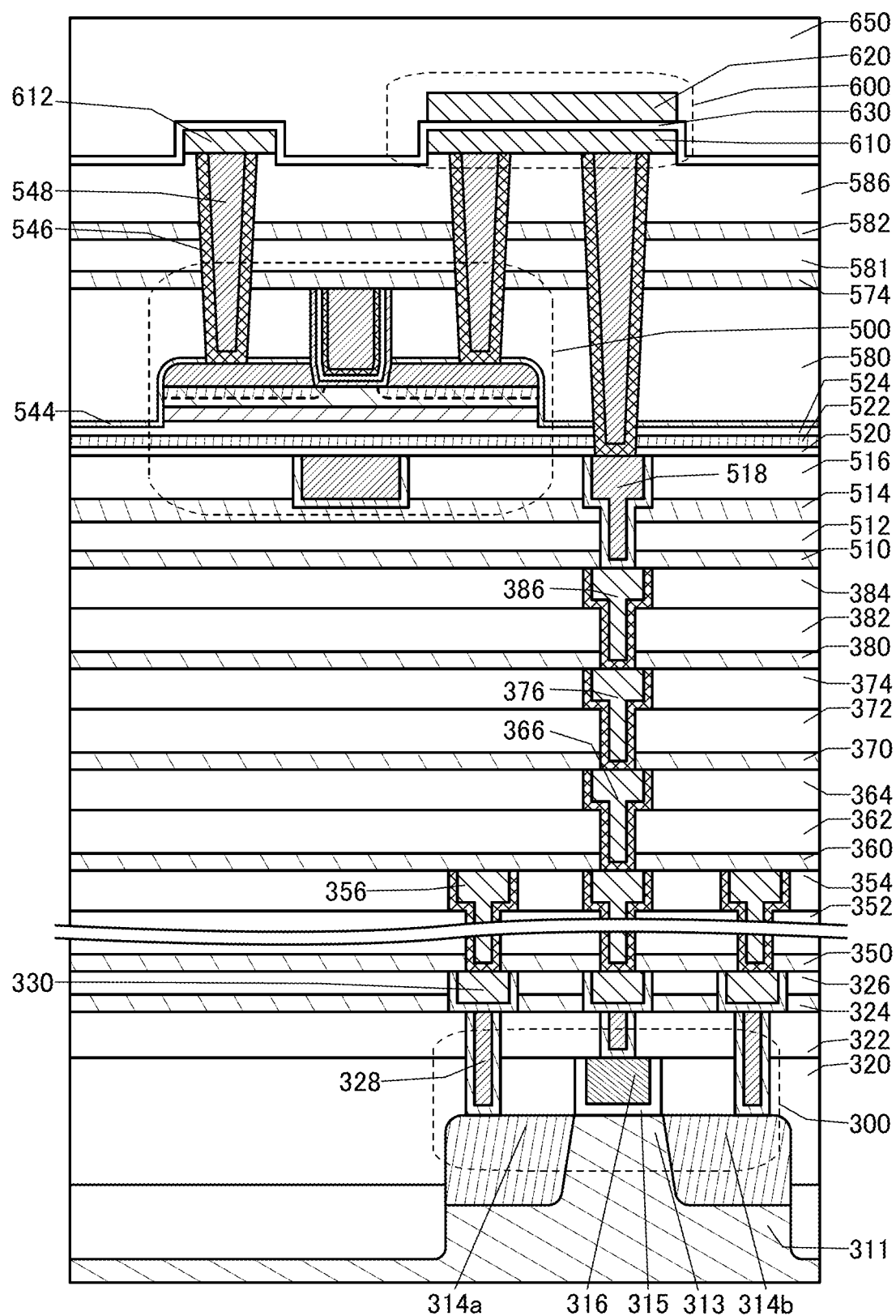
FIG. 7 is a schematic cross-sectional view illustrating the structure of a semiconductor device.
Figure 9A:
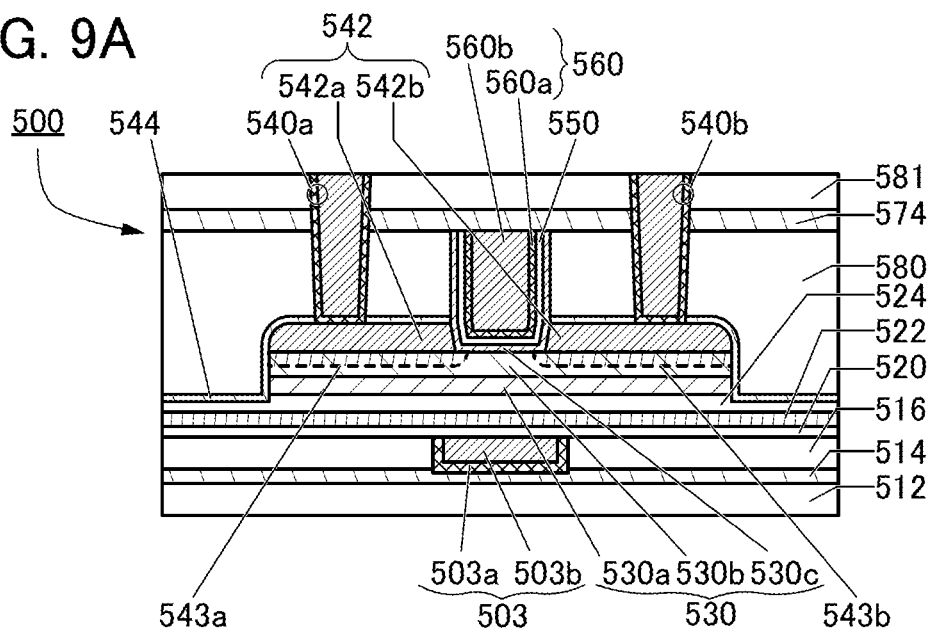
FIG. 9A, FIG. 9B, and FIG. 9C are schematic cross-sectional views illustrating the structure of a semiconductor device.
Figure 9B:
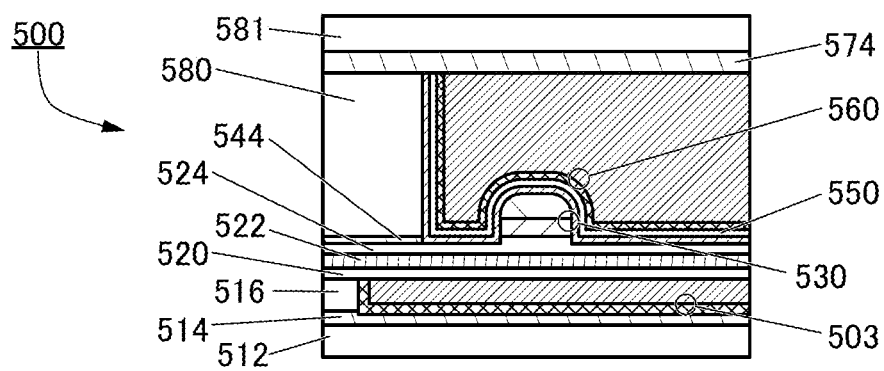
Figure 9C:
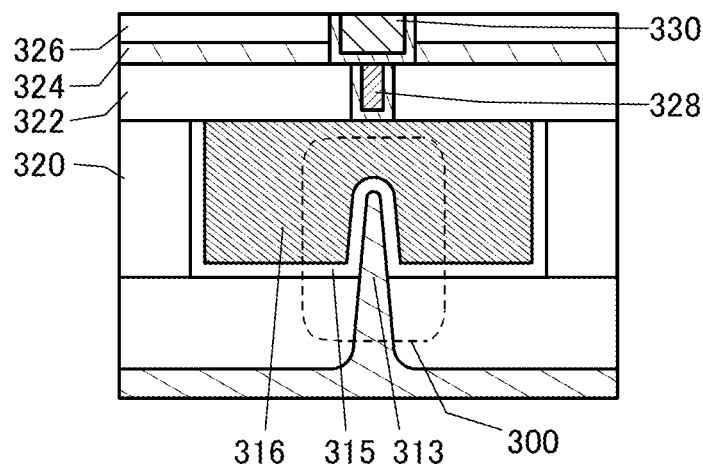

A semiconductor device illustrated in FIG. 7 includes a transistor 300, a transistor 500, and a capacitor 600. FIG. 9A is a cross-sectional view of the transistor 500 in the channel length direction, FIG. 9B is a cross-sectional view of the transistor 500 in the channel width direction, and FIG. 9C is a cross-sectional view of the transistor 300 in the channel width direction.

The transistor 500 is a transistor including a metal oxide in its channel formation region (an OS transistor). Since the off-state current of the transistor 500 is low, the use of the transistor 500 in a semiconductor device, particularly as the transistor M1 to the transistor M6 and the like in the circuit SHLV, enables long-term retention of written data. In other words, the frequency of refresh operation is low or refresh operation is not required; thus, power consumption of the semiconductor device can be reduced.

The semiconductor device described in this embodiment includes the transistor 300, the transistor 500, and the capacitor 600 as illustrated in FIG. 7. The transistor 500 is provided above the transistor 300, and the capacitor 600 is provided above the transistor 300 and the transistor 500. Note that the capacitor 600 can be the capacitor C1, the capacitor C2, or the like in the semiconductor device 100 and the semiconductor devices 100A to 100D.

The transistor 300 is provided on a substrate 311 and includes a conductor 316, an insulator 315, a semiconductor region 313 that is part of the substrate 311, and a low-resistance region 314a and a low-resistance region 314b functioning as a source region and a drain region. Note that the transistor 300 can be used as the transistor in the above embodiment, for example.

A semiconductor substrate (e.g., a single crystal substrate or a silicon substrate) is preferably used as the substrate 311.

As shown in FIG. 9C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that the work function depends on a material used for a conductor; therefore, the threshold voltage of the transistor can be adjusted by selecting the material for the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 8:
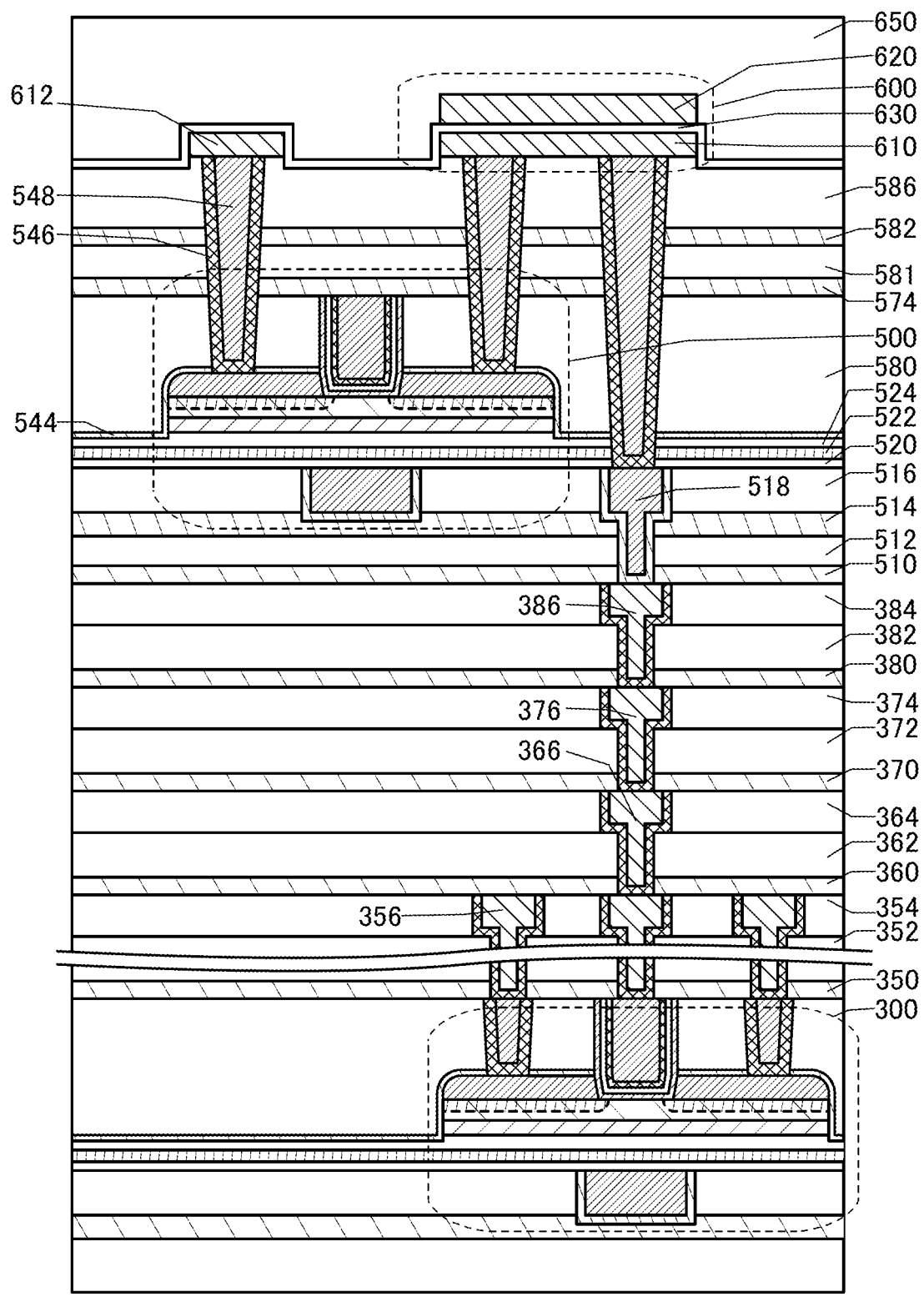
FIG. 8 is a schematic cross-sectional view illustrating the structure of a semiconductor device.

Note that the transistor 300 illustrated in FIG. 7 is an example and the structure is not limited thereto; a transistor appropriate for a circuit structure or a driving method is used. For example, when a semiconductor device is a single-polarity circuit using only OS transistors, the transistor 300 has a structure similar to that of the transistor 500 using an oxide semiconductor, as illustrated in FIG. 8. Note that the details of the transistor 500 will be described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification and the like, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided below the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. The diffusion of hydrogen into a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less that of the insulator 324. The use of a material having a low permittivity for an interlayer film can reduce the parasitic capacitance between wirings.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 7, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

As the insulator 350, it is preferable to use, for example, an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by the barrier layer, so that the diffusion of hydrogen from the transistor 300 into the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 7, an insulator 360, an insulator 362, and an insulator 364 are provided to be stacked in this order. Moreover, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

As the insulator 360, it is preferable to use, for example, an insulator having a barrier property against hydrogen, like the insulator 324. Furthermore, the conductor 366 preferably includes a conductor having a barrier property against hydrogen. The conductor having a barrier property against hydrogen is formed particularly in an opening of the insulator 360 having a barrier property against hydrogen. With this structure, the transistor 300 and the transistor 500 can be separated by the barrier layer, so that the diffusion of hydrogen from the transistor 300 into the transistor 500 can be inhibited.

A wiring layer may be provided over the insulator 364 and the conductor 366. For example, in FIG. 7, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

As the insulator 370, it is preferable to use, for example, an insulator having a barrier property against hydrogen, like the insulator 324. Furthermore, the conductor 376 preferably includes a conductor having a barrier property against hydrogen. The conductor having a barrier property against hydrogen is formed particularly in an opening of the insulator 370 having a barrier property against hydrogen. With this structure, the transistor 300 and the transistor 500 can be separated by the barrier layer, so that the diffusion of hydrogen from the transistor 300 into the transistor 500 can be inhibited.

A wiring layer may be provided over the insulator 374 and the conductor 376. For example, in FIG. 7, an insulator 380, an insulator 382, and an insulator 384 are provided to be stacked in this order. Moreover, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

As the insulator 380, it is preferable to use, for example, an insulator having a barrier property against hydrogen, like the insulator 324. Furthermore, the conductor 386 preferably includes a conductor having a barrier property against hydrogen. The conductor having a barrier property against hydrogen is formed particularly in an opening of the insulator 380 having a barrier property against hydrogen. With this structure, the transistor 300 and the transistor 500 can be separated by the barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, or the number of wiring layers similar to the wiring layer including the conductor 356 may be five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. The diffusion of hydrogen into a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. The use of a material with a relatively low permittivity for these insulators can reduce the parasitic capacitance generated between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided over the insulator 516.

As illustrated in FIG. 9A and FIG. 9B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530*a* positioned over the insulator 524, an oxide 530*b* positioned over the oxide 530*a*, a conductor 542*a* and a conductor 542*b* positioned apart from each other over the oxide 530*b*, an insulator 580 that is positioned over the conductor 542*a* and the conductor 542*b* and is provided with an opening formed to overlap with a region between the conductor 542*a* and the conductor 542*b*, an oxide 530*c* positioned on a bottom surface and a side surface of the opening, an insulator 550 positioned on the formation surface of the oxide 530*c*, and a conductor 560 positioned on the formation surface of the insulator 550.

As illustrated in FIG. 9A and FIG. 9B, an insulator 544 is preferably provided between the insulator 580 and the oxide 530*a*, the oxide 530*b*, the conductor 542*a*, and the conductor 542*b*. As illustrated in FIG. 9A and FIG. 9B, the conductor 560 preferably includes a conductor 560*a* provided inside the insulator 550 and a conductor 560*b* provided to be embedded inside the conductor 560*a*. As illustrated in FIG. 9A and FIG. 9B, an insulator 574 is preferably provided over the insulator 580, the conductor 560, and the insulator 550.

Hereinafter, the oxide 530*a*, the oxide 530*b*, and the oxide 530*c* may be collectively referred to as an oxide 530.

The transistor 500 has a structure in which the three layers of the oxide 530*a*, the oxide 530*b*, and the oxide 530*c* are stacked in the region where the channel is formed and its vicinity; however, the present invention is not limited to this. For example, the transistor may have a single-layer structure of the oxide 530*b*, a two-layer structure of the oxide 530*b* and the oxide 530*a*, a two-layer structure of the oxide 530*b* and the oxide 530*c*, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. Moreover, the transistor 500 illustrated in FIG. 7 and FIG. 9A is an example and the structure is not limited thereto; an appropriate transistor is used in accordance with a circuit structure or a driving method.

Here, the conductor 560 functions as a gate electrode of the transistor, and the conductor 542*a* and the conductor 542*b* function as a source electrode and a drain electrode. As described above, the conductor 560 is embedded in an opening of the insulator 580 and the region sandwiched between the conductor 542*a* and the conductor 542*b*. The positions of the conductor 560, the conductor 542*a*, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and each of the conductor 542a and the conductor 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of the opening in the insulator 514 and the insulator 516, and a conductor 503b is formed further inside. Although the transistor 500 in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, for the conductor 503b, it is preferable to use a conductive material that has high conductivity and contains tungsten, copper, or aluminum as its main component. In that case, a conductor 505 is not necessarily provided. Note that the conductor 503b is a single layer in the diagram but may have a stacked-layer structure, for example, a stack of any of the above conductive materials and titanium or titanium nitrided.

The insulator 520, the insulator 522, and the insulator 524 have a function of a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O + H$" occurs. Part of hydrogen generated at this time is bonded to oxygen to be $H_2O$, and removed from the oxide 530 or an insulator in the vicinity of the oxide 530 in some cases. Part of hydrogen is diffused into or gettered (also referred to as gettering) by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O + O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulating film. When a high-k material is used for an insulator functioning as the gate insulating film, a gate potential at the time when the transistor operates can be lowered while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high relative permittivity can be obtained.

Note that the transistor 500 in FIG. 9A and FIG. 9B includes the insulator 520, the insulator 522, and the insulator 524 as the second gate insulating film having a three-layer structure; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. In particular, the In-M-Zn oxide which can be used for the oxide 530 is preferably a CAAC-OS (C-Axis Aligned Crystalline Oxide Semiconductor) or a CAC-OS (Cloud-Aligned Composite Oxide Semiconductor). Alternatively, an In—Ga oxide or an In—Zn oxide may be used as the oxide 530.

Furthermore, a metal oxide with a low carrier concentration is preferably used for the transistor 500. In the case where the carrier concentration of the metal oxide is reduced, the concentration of impurities in the metal oxide is reduced so that the density of defect states is reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide easily moves by stress such as heat and an electric field; thus, the reliability of a transistor may be low when the metal oxide contains a plenty of hydrogen. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_O H$ is reduced enough. When a metal oxide in which impurities such as $V_O H$ are sufficiently reduced is used for a channel formation region of a transistor, stable electrical characteristics can be given.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with sufficiently reduced concentration of impurities such as hydrogen is used for a channel formation region of a transistor, stable electrical characteristics can be given.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

When a metal oxide is used as the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b. It is highly possible that oxidation of the conductor 542a and the conductor 542b lowers the conductivity of the conductor 542a and the conductor 542b. Note that diffusion of oxygen from the oxide 530 into the conductor 542a and the conductor 542b can be interpreted as absorption of oxygen in the oxide 530 by the conductor 542a and the conductor 542b.

When oxygen in the oxide 530 is diffused into the conductor 542a and the conductor 542b, a layer is sometimes formed between the conductor 542a and the oxide 530b and between the conductor 542b and the oxide 530b. Since the layer contains a larger amount of oxygen than the conductor 542a and the conductor 542b, the layer seems to have an insulating property. In this case, a three-layer structure of the conductor 542a or the conductor 542b, the layer, and the oxide 530b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

The above layer is not necessarily formed between the oxide 530b and each of the conductor 542a and the conductor 542b; for example, the layer may be formed between the oxide 530c and each of the conductor 542a and the conductor 542b, or between the oxide 530b and each of the conductor 542a and the conductor 542b and between the oxide 530c and each of the conductor 542a and the conductor 542b.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

The oxide 530 preferably has a stacked-layer structure of a plurality of oxide layers that differ in the atomic ratio of metal atoms. Specifically, the atomic proportion of the element M to the constituent elements in the metal oxide used as the oxide 530a is preferably greater than the atomic proportion of the element M to the constituent elements in the metal oxide used as the oxide 530b. The atomic proportion of the element M to In in the metal oxide used as the oxide 530a is preferably greater than the atomic proportion of the element M to In in the metal oxide used as the oxide 530b. The atomic proportion of In to the element M in the metal oxide used as the oxide 530b is preferably greater than the atomic proportion of In to the element M in the metal oxide used as the oxide 530a. As the oxide 530c, a metal oxide that can be used as the oxide 530a or the oxide 530b can be used.

The energy of the conduction band minimum of the oxide 530a and the oxide 530c is preferably higher than the energy of the conduction band minimum of the oxide 530b. In other words, the electron affinity of the oxide 530a and the oxide 530c is preferably smaller than the electron affinity of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 9A and FIG. 9B, a stacked-layer structure of two or more layers may be employed. For example, a tantalum nitride film and a tungsten film can be stacked. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 9A, a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose the conductivity even after absorbing oxygen. Design is appropriately determined in consideration of required transistor characteristics.

With the insulator 544, diffusion of impurities such as water and hydrogen contained in the insulator 580 into the oxide 530b through the oxide 530c and the insulator 550 can be inhibited. Moreover, oxidation of the conductor 560 due to excess oxygen contained in the insulator 580 can be inhibited.

The insulator 550 functions as a first gate insulating film. The insulator 550 is preferably provided in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 into the conductor 560. Providing the metal oxide that inhibits oxygen diffusion suppresses diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Note that the insulator 550 may have a stacked-layer structure like the second gate insulating film. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high relative permittivity.

Although the conductor 560 functioning as the first gate electrode has a two-layer structure in FIG. 9A and FIG. 9B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. In addition, for the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

For the conductor 560b, it is preferable to use a conductive material containing tungsten, copper, or aluminum as its main component. The conductor 560b also functions as a wiring and thus a conductor having high conductivity is preferably used. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening of the insulator 580 overlaps with the region between the conductor 542a and the conductor 542b. Accordingly, the conductor 560 is formed to be embedded in the opening of the insulator 580 and the region sandwiched between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when the conductor 560 has a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film deposited by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 sandwiched therebetween. The conductor 540a and the conductor 540b each have a structure similar to that of a conductor 546 and a conductor 548 that will be described later.

An insulator 582 is provided over the insulator 581. A material having a barrier property against oxygen and hydrogen is preferably used for the insulator 582. Thus, the insulator 582 can be provided using a material similar to that for the insulator 514. For example, a metal oxide such as aluminum oxide, hafnium oxide, or tantalum oxide is preferably used for the insulator 582.

In particular, aluminum oxide has an excellent blocking effect that prevents transmission of oxygen and impurities such as hydrogen and moisture which would cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be provided using a material similar to that for the insulator 320. The use of a material with a relatively low permittivity for these insulators can reduce the parasitic capacitance generated between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be provided using a material similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. The insulator having a high barrier property against hydrogen or water is provided using a material similar to that for the insulator 522, for example.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 7; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 therebetween. For the conductor 620, a conductive material such as a metal material, an alloy material, or a metal oxide material can be used.

It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be reduced and the reliability can be improved in a semiconductor device using a transistor including an oxide semiconductor. Alternatively, a semiconductor device using a transistor including an oxide semiconductor can be miniaturized or highly integrated.

Next, a capacitor that can be used in the semiconductor devices in FIG. 7 and FIG. 8 is described.

Figure 10A:
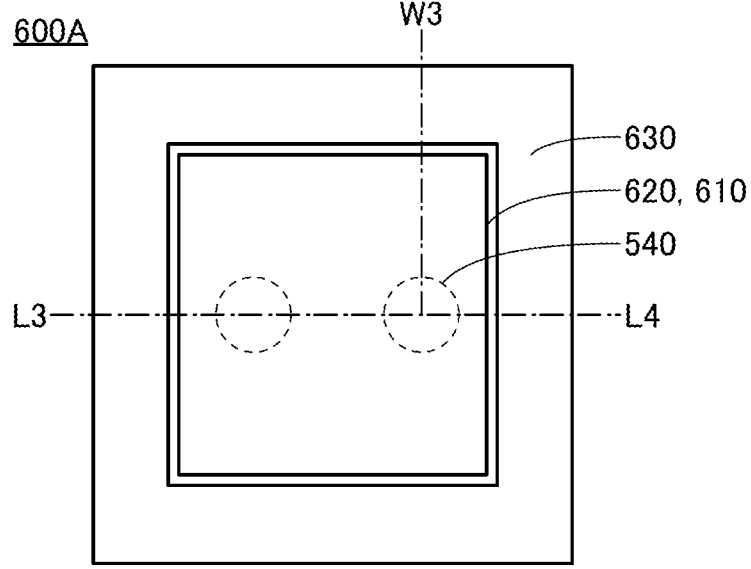
FIG. 10A, FIG. 10B, and FIG. 10C are a top view and perspective views illustrating a structure example of a capacitor.
Figure 10B:
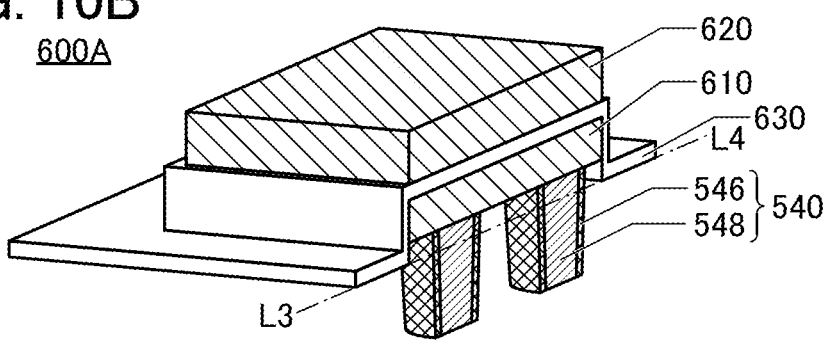
Figure 10C:
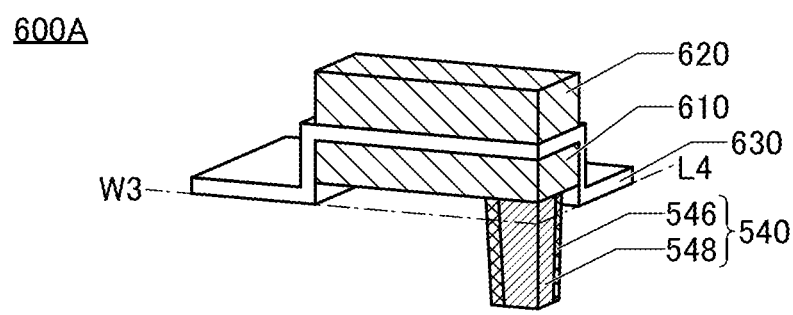

FIG. 10 illustrates a capacitor 600A as an example of the capacitor 600 that can be used in the semiconductor device shown in FIG. 7. FIG. 10A is a top view of the capacitor 600A, FIG. 10B is a perspective view illustrating a cross section of the capacitor 600A along the dashed-dotted line L3-L4, and FIG. 10C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric between the pair of electrodes.

The bottom portion of the conductor 610 in the capacitor 600A is electrically connected to the conductor 546 and the conductor 548. The conductor 546 and the conductor 548 function as plugs or wirings for connecting to another circuit element. In FIG. 10A to FIG. 10C, the conductor 546 and the conductor 548 are collectively denoted as a conductor 540.

For clarification of the drawing, the insulator 586 in which the conductor 546 and the conductor 548 are embedded and the insulator 650 that covers the conductor 620 and the insulator 630 are omitted in FIG. 10A to FIG. 10C.

Although the capacitor 600 in FIG. 7 and FIG. 8 and the capacitor 600A in FIG. 10A to FIG. 10C are planar capacitors, the shape of the capacitor is not limited thereto. For example, the capacitor 600 (capacitor 600A) may be a cylindrical capacitor 600B illustrated in FIG. 11A to FIG. 11C.

Figure 11A:
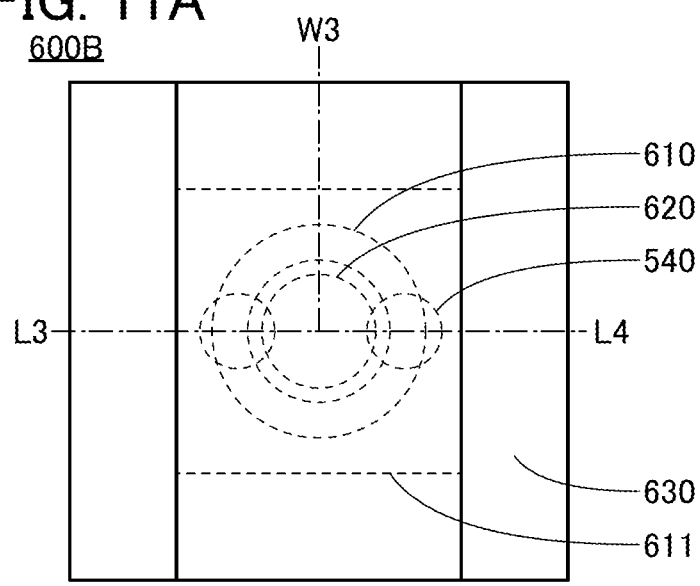
FIG. 11A, FIG. 11B, and FIG. 11C are a top view and perspective views illustrating a structure example of a capacitor.
Figure 11B:
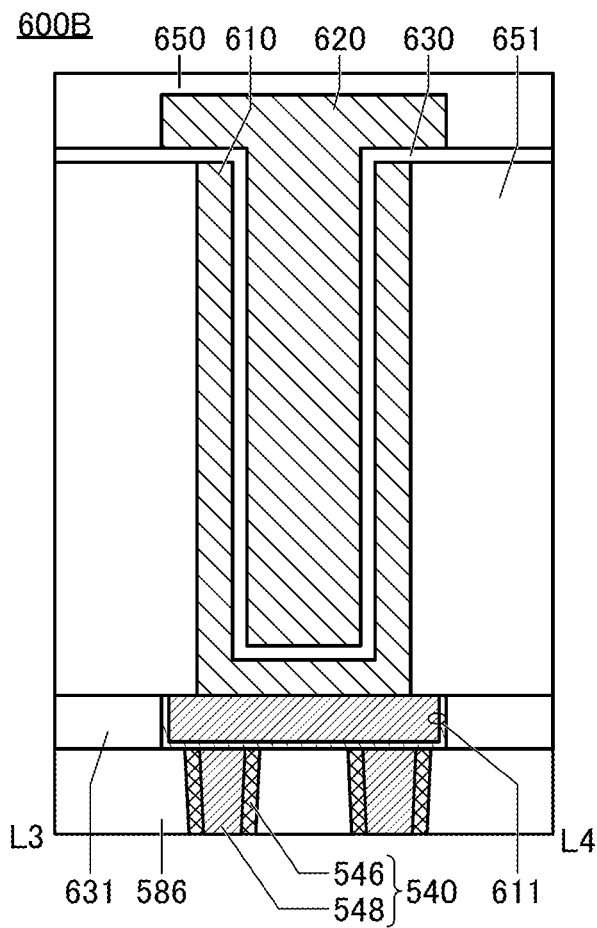
Figure 11C:
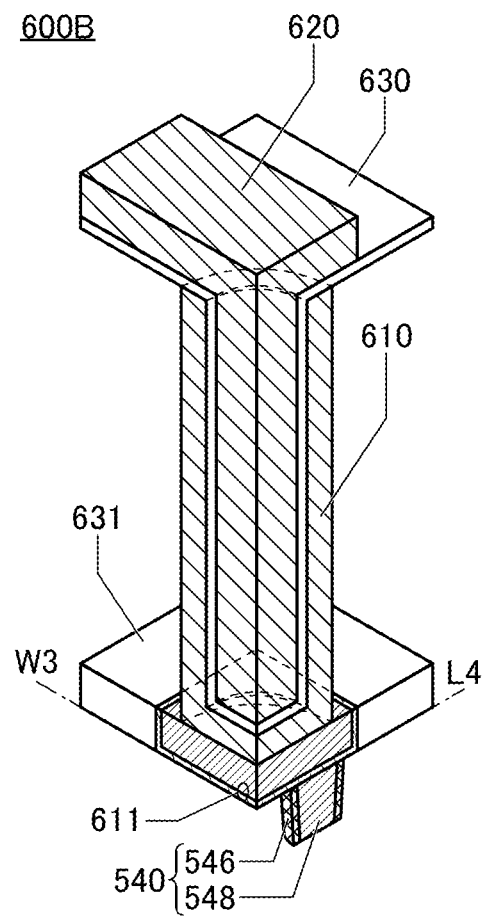

FIG. 11A is a top view of the capacitor 600B, FIG. 11B is a perspective view illustrating a cross section of the capacitor 600B along the dashed-dotted line L3-L4, and FIG. 11C is a perspective view illustrating a cross section of the capacitor 600B along the dashed-dotted line W3-L4.

In FIG. 11B, the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For clarification of the drawing, the insulator 586, an insulator 650, and the insulator 651 are omitted in FIG. 11C.

For the insulator 631, a material similar to that for the insulator 586 can be used, for example.

A conductor 611 is embedded in the insulator 631 to be electrically connected to the conductor 540. For the conductor 611, a material similar to those for the conductor 330 and the conductor 518 can be used, for example.

For the insulator 651, a material similar to that for the insulator 586 can be used, for example.

The insulator 651 has an opening as described above, and the opening overlaps with the conductor 611.

The conductor 610 is formed on the bottom portion and the side surface of the opening. In other words, the conductor 610 overlaps with the conductor 611 and is electrically connected to the conductor 611.

The conductor 610 is formed in such a manner that an opening is formed in the insulator 651 by an etching method or the like, and then the conductor 610 is deposited by a sputtering method, an ALD method, or the like. After that, the conductor 610 deposited over the insulator 651 is removed by a CMP (Chemical Mechanical Polishing) method or the like while the conductor 610 deposited in the opening is left.

The insulator 630 is positioned over the insulator 651 and over the formation surface of the conductor 610. Note that the insulator 630 functions as a dielectric between the pair of electrodes in the capacitor.

The conductor 620 is formed over the insulator 630 so as to fill the opening of the insulator 651.

The insulator 650 is formed to cover the insulator 630 and the conductor 620.

The capacitance value of the cylindrical capacitor 600B illustrated in FIG. 11A to FIG. 11C can be higher than that of the planar capacitor 600A. Thus, when the capacitor 600B is used as the capacitor C1, the capacitor C2, and the like described in the above embodiment, for example, a voltage between the terminals of the capacitor can be maintained for long time.

Note that this embodiment can be combined with any of the other embodiments in this specification as appropriate.

Embodiment 3

In this embodiment, the compositions of a CAC-OS (Cloud-Aligned Composite Oxide Semiconductor) and a CAAC-OS (c-axis Aligned Crystalline Oxide Semiconductor) which are metal oxides that can be used in the OS transistor described in the above embodiment is described. Note that in this specification and the like, CAC refers to an example of a function or a material composition and CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current driving capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of a non-single-crystal oxide semiconductor include a CAAC-OS (c-axis aligned crystal crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is sometimes referred to as a highly purified intrinsic or substantially highly purified intrinsic state, or is sometimes referred to as an intrinsic or substantially intrinsic state.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 4

In this embodiment, examples of a semiconductor wafer where the semiconductor device or the like described in the above embodiment is formed and electronic components incorporating the semiconductor device will be described.

<Semiconductor Wafer>

First, an example of a semiconductor wafer where a semiconductor device or the like is formed is described with reference to FIG. 12A.

Figure 12A:
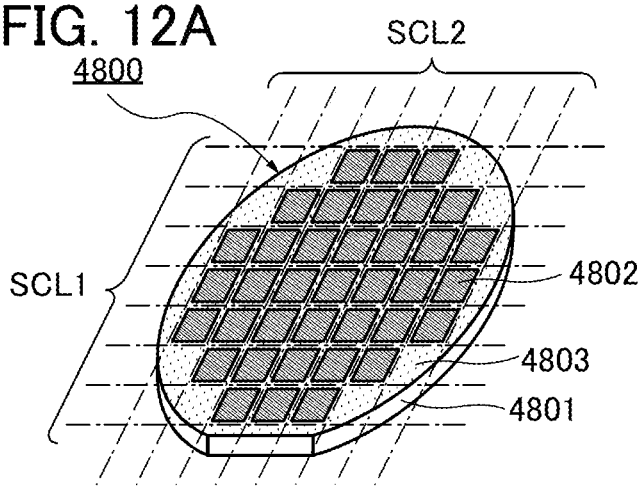
FIG. 12A, FIG. 12B, FIG. 12C, and FIG. 12D are perspective views illustrating examples of a semiconductor wafer and electronic components.

A semiconductor wafer 4800 illustrated in FIG. 12A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 12B:
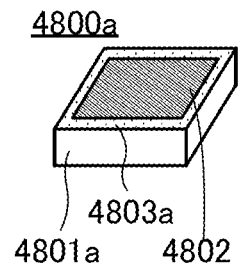

With the dicing step, a chip 4800a as illustrated in FIG. 12B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 12A. The element substrate may be a rectangular semiconductor wafer, for example. The shape of the element substrate can be changed as appropriate, depending on a manufacturing process of an element and an apparatus for manufacturing the element.

<Electronic Components>

Next, examples of electronic components incorporating the chip 4800a are described with reference to FIG. 12C and FIG. 12D.

Figure 12C:
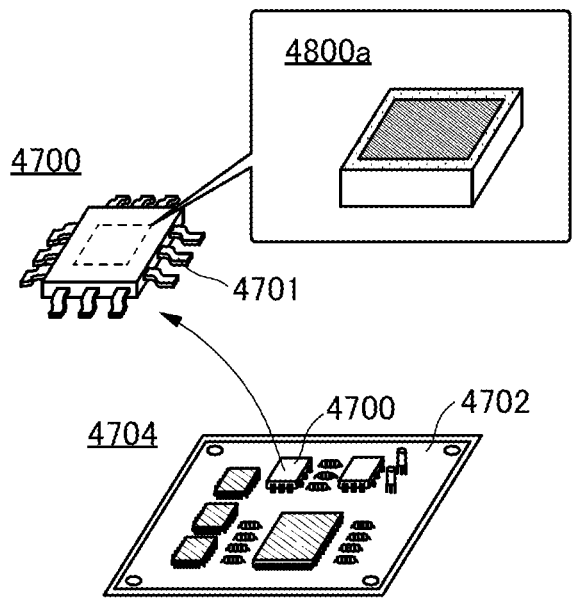

FIG. 12C is a perspective view of an electronic component 4700 and a substrate (a mounting board 4704) on which the electronic component 4700 is mounted. The electronic component 4700 illustrated in FIG. 12C includes a lead 4701 and the above-described chip 4800a, and functions as an IC chip or the like.

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a QFP (Quad Flat Package) is used as the package of the electronic component 4700 in FIG. 12C, the mode of the package is not limited thereto.

The electronic component 4700 is mounted on a printed circuit board 4702, for example. A plurality of such IC chips are combined and electrically connected to each other on the printed circuit board 4702, whereby the mounting board 4704 is completed.

Figure 12D:
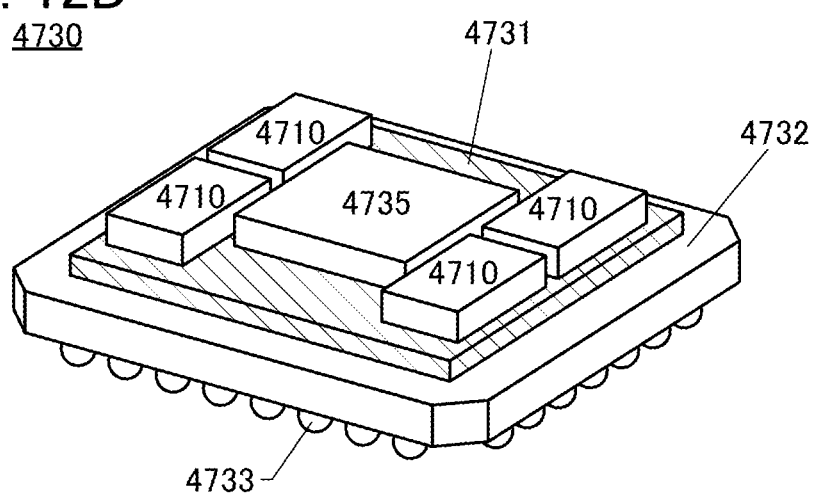

FIG. 12D is a perspective view of an electronic component 4730. The electronic component 4730 is an example of a SiP (System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 12D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments in this specification as appropriate.

Embodiment 5

In this embodiment, structures of a power storage device and a power storage system to which the semiconductor device and the electronic component including the semiconductor device, which are described in the above embodiments, can be applied will be described.

[Cylindrical Secondary Battery]

Figure 13A:
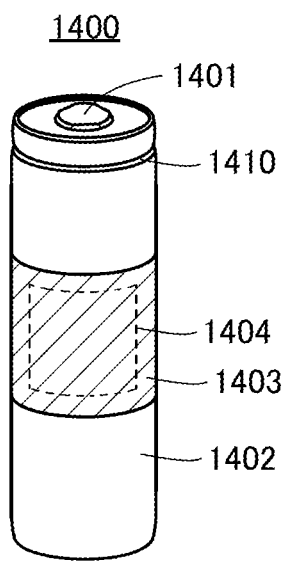
FIG. 13A, FIG. 13B, FIG. 13C, and FIG. 13D are perspective views illustrating examples of power storage devices.

An example of a cylindrical secondary battery is described with reference to FIG. 13A. A cylindrical secondary battery 1400 includes, as illustrated in FIG. 13A, a positive electrode cap (battery lid) 1401 on the top surface and a battery can (outer can) 1402 on the side and bottom surfaces. The positive electrode cap 1401 and the battery can (outer can) 1402 are insulated from each other by a gasket (insulating packing) 1410.

In the secondary battery 1400, a control circuit 1404 that is formed on or fixed to a substrate 1403 having flexibility may be provided along a side surface of the secondary battery 1400. As the control circuit 1404, any of the semiconductor device 100, the semiconductor device 100A to the semiconductor device 100D, and the like described in the above embodiment can be used. When the control circuit 1404 is provided on the substrate 1403, the control circuit 1404 can be provided along a curved surface of the cylindrical secondary battery 1400. As a result, a space occupied by the control circuit 1404 can be reduced. Thus, it is possible to downsize an electronic device or the like including the secondary battery 1400 and the control circuit 1404.

Examples of the substrate 1403 having flexibility include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, paper, and the like.

Figure 13B:
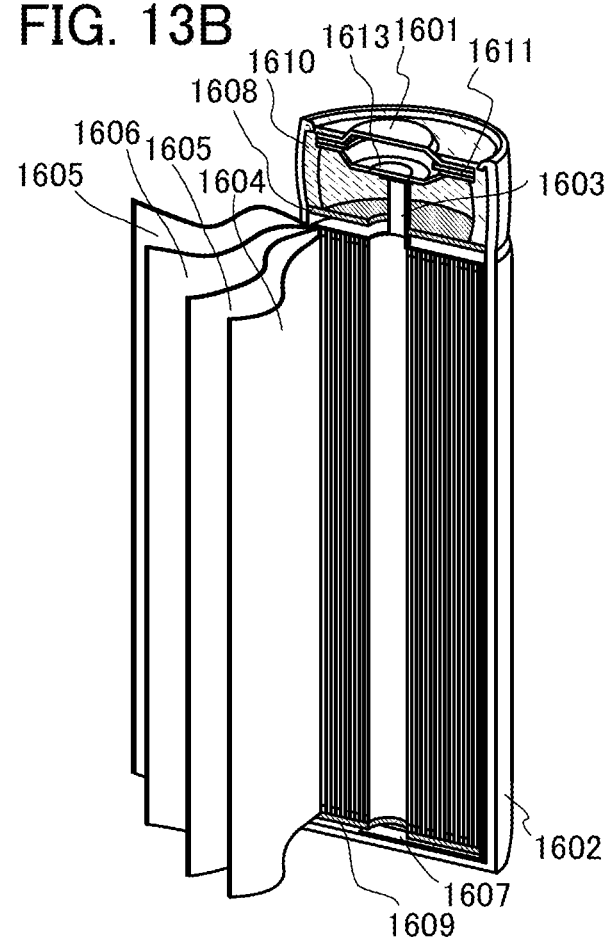

FIG. 13B is a schematic cross-sectional view of a cylindrical secondary battery. As illustrated in FIG. 13B, the cylindrical secondary battery includes a positive electrode cap (battery lid) 1601 on a top surface and a battery can (outer can) 1602 on a side surface and a bottom surface. The positive electrode cap and the battery can (outer can) 1602 are insulated from each other by a gasket (insulating packing) 1610.

Inside the battery can 1602 having a hollow cylindrical shape, a battery element in which a belt-like positive electrode 1604 and a belt-like negative electrode 1606 are wound with a separator 1605 located therebetween is provided. Although not illustrated, the battery element is wound centering around a center pin. One end of the battery can 1602 is closed and the other end thereof is open. For the battery can 1602, a metal having a corrosion-resistant property to an electrolyte solution, such as nickel, aluminum, or titanium, an alloy of such a metal, or an alloy of such a metal and another metal (e.g., stainless steel) can be used. Alternatively, the battery can 1602 is preferably covered with nickel, aluminum, or the like in order to prevent corrosion due to the electrolyte solution. Inside the battery can 1602, the battery element in which the positive electrode, the negative electrode, and the separator are wound is sandwiched between a pair of insulating plates 1608 and 1609 that face each other. Furthermore, a nonaqueous electrolyte (not illustrated) is injected inside the battery can 1602 provided with the battery element. As the nonaqueous electrolyte, a nonaqueous electrolyte that is similar to that for the coin-type secondary battery can be used.

Since a positive electrode and a negative electrode that are used for a cylindrical storage battery are wound, active materials are preferably formed on both surfaces of a current collector. A positive electrode terminal (positive electrode current collector lead) 1603 is connected to the positive electrode 1604, and a negative electrode terminal (negative electrode current collector lead) 1607 is connected to the negative electrode 1606. For both the positive electrode terminal 1603 and the negative electrode terminal 1607, a metal material such as aluminum can be used. The positive electrode terminal 1603 and the negative electrode terminal 1607 are resistance-welded to a safety valve mechanism 1613 and the bottom of the battery can 1602, respectively. The safety valve mechanism 1613 is electrically connected to the positive electrode cap 1601 through a PTC (Positive Temperature Coefficient) element 1611. The safety valve mechanism 1613 cuts off electrical connection between the positive electrode cap 1601 and the positive electrode 1604 when the internal pressure of the battery exceeds a predetermined threshold. In addition, the PTC element 1611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 13C:
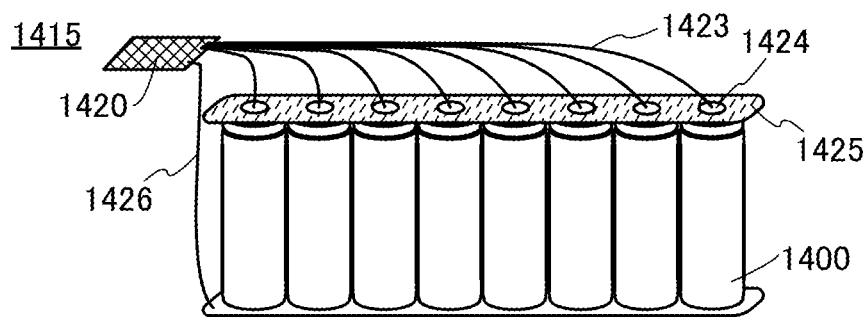

FIG. 13C illustrates an example of a power storage system 1415. The power storage system 1415 includes a plurality of secondary batteries 1400. Positive electrodes of the secondary batteries are in contact with conductors 1424 isolated by an insulator 1425 and are electrically connected. The conductor 1424 is electrically connected to a control circuit 1420 through a wiring 1423. Negative electrodes of the secondary batteries are electrically connected to the control circuit 1420 through a wiring 1426. Any of the semiconductor device 100 and the semiconductor device 100A to the semiconductor device 100D (or the electronic component provided with any of the semiconductor device 100 and the semiconductor device 100A to the semiconductor device 100D), which are described in the above embodiment, can be used as the control circuit 1420.

Figure 13D:
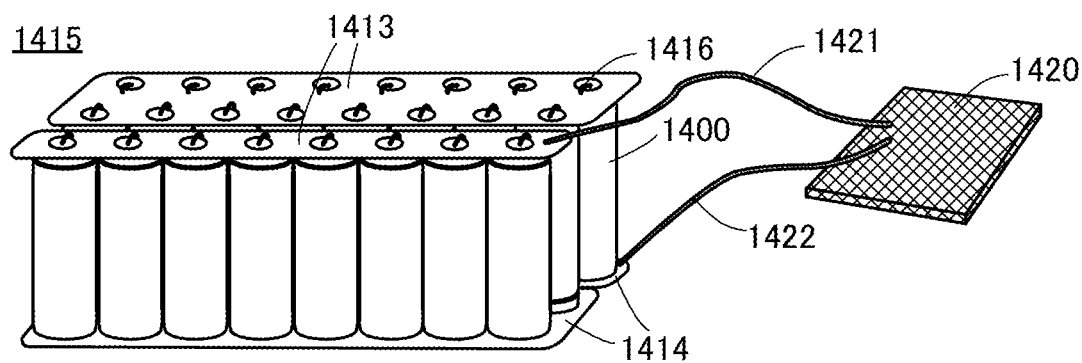

FIG. 13D illustrates an example of the power storage system 1415. The power storage system 1415 includes the plurality of secondary batteries 1400, and the plurality of secondary batteries 1400 are sandwiched between a conductive plate 1413 and a conductive plate 1414. The plurality of secondary batteries 1400 are electrically connected to the conductive plate 1413 and the conductive plate 1414 through a wiring 1416. The plurality of secondary batteries 1400 may be connected parallel to each other, connected in series, or connected in series after being connected parallel to each other. With the power storage system 1415 including the plurality of secondary batteries 1400, large electric power can be extracted.

A temperature control device may be provided between the plurality of secondary batteries 1400. When the secondary batteries 1400 are heated excessively, the temperature control device can cool them, and when the secondary batteries 1400 are cooled too much, the temperature control device can heat them. Thus, the performance of the power storage system 1415 is not easily influenced by the outside air temperature.

In FIG. 13D, the power storage system 1415 is electrically connected to the control circuit 1420 through a wiring 1421 and a wiring 1422. As the control circuit 1420, the battery control circuit described in the above embodiment can be used. The wiring 1421 is electrically connected to the positive electrodes of the plurality of the secondary batteries 1400 through the conductive plate 1413, and the wiring 1422 is electrically connected to the negative electrodes of the plurality of the secondary batteries 1400 through the conductive plate 1414.

[Secondary Battery Pack]

Next, examples of the power storage system of one embodiment of the present invention are described with reference to FIG. 14A to FIG. 14C.

Figure 14A:
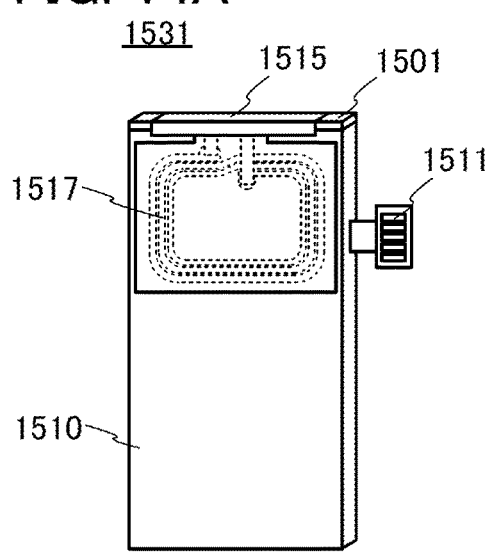
FIG. 14A, FIG. 14B, and FIG. 14C are perspective views illustrating examples of a power storage device.
Figure 14B:
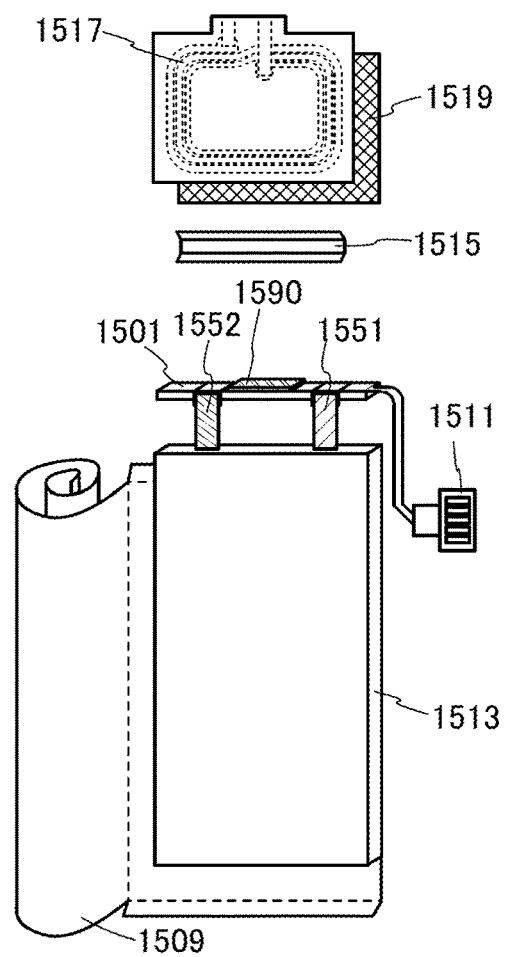

FIG. 14A is an external view of a secondary battery pack 1531. FIG. 14B illustrates the structure of the secondary battery pack 1531. The secondary battery pack 1531 includes a circuit board 1501 and a secondary battery 1513. A label 1509 is attached onto the secondary battery 1513. The circuit board 1501 is fixed by a sealant 1515. The secondary battery pack 1531 includes an antenna 1517.

The circuit board 1501 includes a control circuit 1590. As the control circuit 1590, the battery control circuit described in the above embodiment can be used. For example, as illustrated in FIG. 14B, the control circuit 1590 is provided over the circuit board 1501. The circuit board 1501 is electrically connected to a terminal 1511. The circuit board 1501 is electrically connected to the antenna 1517, one 1551 of a positive electrode lead and a negative electrode lead of the secondary battery 1513, and the other 1552 of the positive electrode lead and the negative electrode lead.

Figure 14C:
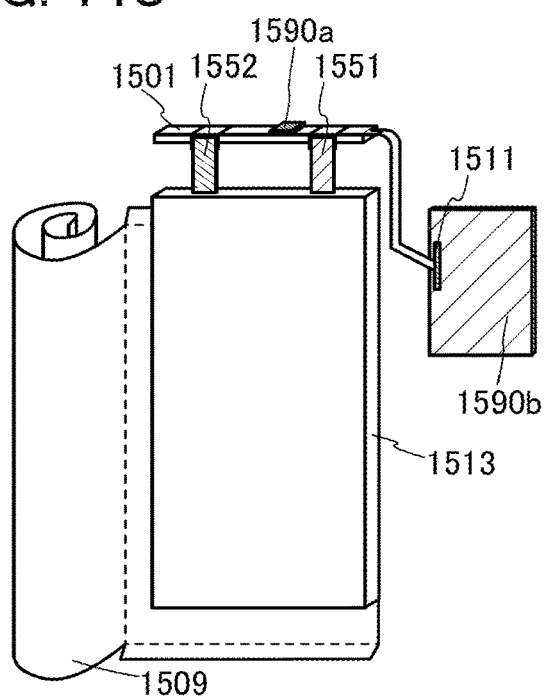

Alternatively, as illustrated in FIG. 14C, a circuit system 1590a provided over the circuit board 1501 and a circuit system 1590b electrically connected to the circuit board 1501 through the terminal 1511 may be included. For example, a part of the control circuit of one embodiment of the present invention is provided in the circuit system 1590a, and another part thereof is provided in the circuit system 1590b.

The shape of the antenna 1517 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, the antenna 1517 may be a flat-plate conductor. This flat-plate conductor can serve as one of conductors for electric field coupling. That is, the antenna 1517 can serve as one of two conductors of a capacitor. Thus, electric power can be transmitted and received not only by an electromagnetic field or a magnetic field but also by an electric field.

The secondary battery pack 1531 includes a layer 1519 between the antenna 1517 and the secondary battery 1513. The layer 1519 has a function of blocking an electromagnetic field from the secondary battery 1513, for example. As the layer 1519, for example, a magnetic body can be used.

The secondary battery 1513 includes a wound battery element 1593 as illustrated in FIG. 14C. The battery element 1593 includes a negative electrode 1594, a positive electrode 1595, and separator 1596. The battery element 1593 is obtained by winding a sheet of a stack in which the negative electrode 1594 overlaps with the positive electrode 1595 with the separator 1596 provided therebetween.

Note that this embodiment can be combined with any of the other embodiments in this specification as appropriate.

Embodiment 6

In this embodiment, examples of an electronic device that can be provided with the semiconductor device described in the above embodiment or the electronic component including the semiconductor device, and the power storage device described in the above embodiment will be described.

[Mobile Phone]

Figure 15A:
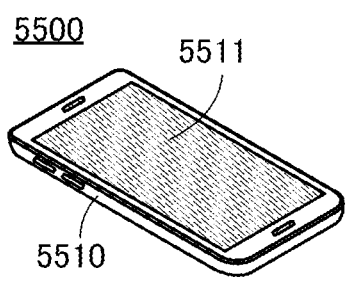
FIG. 15A, FIG. 15B, FIG. 15C, FIG. 15D, FIG. 15E, FIG. 15F, FIG. 15G, FIG. 15H, and FIG. 15I are perspective views illustrating examples of products.

An information terminal 5500 illustrated in FIG. 15A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

When the semiconductor device described in the above embodiment is applied to the information terminal 5500, overcharge and/or overdischarge of a battery provided in the information terminal 5500 can be prevented.

[Wearable Terminal]

Figure 15B:
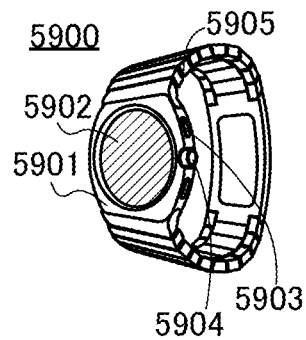

FIG. 15B illustrates a watch-type wearable terminal 5900 as an example of the information terminal. The wearable terminal 5900 includes a housing 5901, a display portion 5902, an operation button 5903, an operator 5904, a band 5905, and the like.

When the semiconductor device described in the above embodiment is applied to the wearable terminal 5900, overcharge or overdischarge of a battery provided in the wearable terminal can be prevented in a manner similar to that in the case of the information terminal 5500.

[Personal Computer]

Figure 15C:
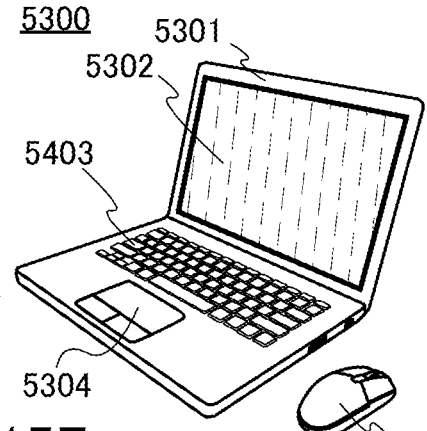

FIG. 15C illustrates a laptop personal computer 5300, which is a type of information terminal. The laptop personal computer 5300 includes a housing 5301, a display portion 5302, a keyboard 5303, and a track-pad type pointing device 5304. Depending on the user's preference, a mouse-type pointing device 5305 can be used for in the laptop personal computer 5300.

When the semiconductor device described in the above embodiment is applied to the laptop personal computer 5300, overcharge or overdischarge of a battery provided in the laptop personal computer 5300 can be prevented in a manner similar to those in the case of the above-described electronic devices. Furthermore, the semiconductor device described in the above embodiment can also be applied to the mouse-type pointing device 5305, in which case overcharge or overdischarge of a battery provided in the mouse-type pointing device 5305 can be prevented in the same manner.

[Game Machines]

Figure 15D:
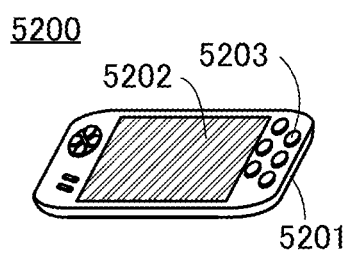

FIG. 15D illustrates a portable game machine 5200 as an example of a game machine. The portable game machine 5200 includes a housing 5201, a display portion 5202, a button 5203, and the like.

Figure 15E:
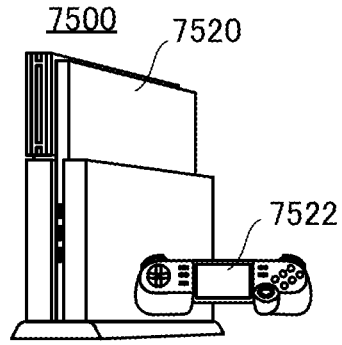

FIG. 15E illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 15E, the controller 7522 can include a display portion that displays a game image, and an input interface besides a button, such as a touch panel, a stick, a rotating knob, and a sliding knob, for example. The shape of the controller 7522 is not limited to that in FIG. 15E, and the shape of the controller 7522 may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary gaming machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the semiconductor device described in the above embodiment is applied to the portable game machine 5200, overcharge or overdischarge of a battery provided in the portable game machine 5200 can be prevented in a manner similar to those in the case of the above-described electronic devices. In the case where the controller 7522 is connected to the stationary game machine 7500 wirelessly, the controller 7522 communicates with the stationary game machine 7500 with a radio wave, and thus is provided with a battery in some cases. Therefore, when the semiconductor device described in the above embodiment is applied to the controller 7522, overcharge or overdischarge of the battery provided in the controller 7522 can be prevented in a manner similar to those in the case of the above-described electronic devices.

[Moving Vehicle]

The semiconductor device described in the above embodiment can be applied to an automobile, which is a moving vehicle.

Figure 15F:
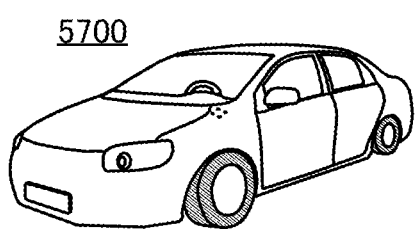

FIG. 15F illustrates an automobile 5700 as an example of a moving vehicle.

An instrument panel that provides various kinds of information by displaying a speedometer, a tachometer, a mileage, a fuel meter, a gearshift indicator, air-conditioning settings, or the like is provided around the driver's seat in the automobile 5700. In addition, a display device showing the above information may be provided around the driver's seat.

In particular, in the case where the automobile 5700 is an electric vehicle provided with a battery, when the semiconductor device described in the above embodiment is applied to the automobile 5700, overcharge or overdischarge of the battery provided in the controller 7522 can be prevented in a manner similar to those in the case of the above-described electronic devices.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket).

[Camera]

The semiconductor device described in the above embodiment can be applied to a camera.

Figure 15G:
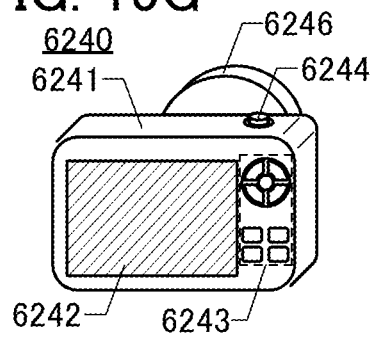

FIG. 15G illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally provided in the digital camera 6240.

When the semiconductor device described in the above embodiment is applied to the digital camera 6240, overcharge or overdischarge of a battery provided in the digital camera 6240 can be prevented in a manner similar to those in the case of the above-described electronic devices.

[Video Camera]

The semiconductor device described in the above embodiment can be applied to a video camera.

Figure 15H:
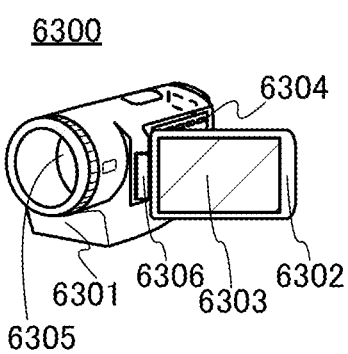

FIG. 15H illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When the semiconductor device described in the above embodiment is applied to the video camera 6300, overcharge or overdischarge of a battery provided in the video camera 6300 can be prevented in a manner similar to those in the case of the above-described electronic devices.

[ICD]

The semiconductor device described in the above embodiment can be applied to an implantable cardioverter-defibrillator (ICD).

Figure 15I:
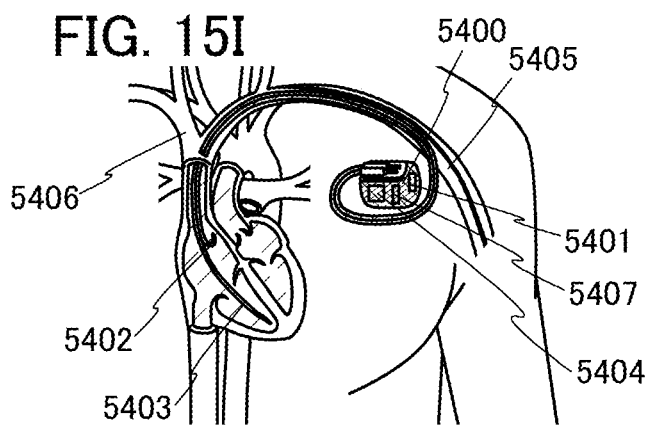

FIG. 15I is a schematic cross-sectional view illustrating an example of an ICD. An ICD body 5400 includes at least a battery 5401, a memory device 5407, a regulator, a control circuit, an antenna 5404, a wire 5402 reaching a right atrium, and a wire 5403 reaching a right ventricle.

The ICD body 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD body 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD body 5400 needs to monitor the heart rate all the time in order to perform pacing and deliver electrical shocks as appropriate. For that reason, the ICD body 5400 includes a sensor for measuring the heart rate. In the ICD body 5400, data on the heart rate obtained by the sensor, the number of times the treatment with pacing is performed, and the time taken for the treatment, for example, can be stored in the memory device 5407.

The antenna 5404 can receive power, and the power is charged into the battery 5401. When the ICD body 5400 includes a plurality of batteries, the safety can be improved. Specifically, even if one of the batteries in the ICD body 5400 is dead, the other batteries can work properly; hence, the batteries also function as an auxiliary power source.

When the semiconductor device described in the above embodiment is applied to the ICD body 5400, overcharge or overdischarge of the battery 5401 can be prevented in a manner similar to those in the case of the above-described electronic devices.

Other than the antenna 5404 capable of receiving electric power, an antenna that can transmit physiological signals may be included. For example, a system that monitors the cardiac activity so as to check physiological signals such as a pulse, a respiratory rate, a heart rate, and body temperature with an external monitoring device may be constructed.

Note that this embodiment can be combined with any of the other embodiments in this specification as appropriate.

REFERENCE NUMERALS

BAT: assembled battery, SHLV: circuit, HCMP: hysteresis comparator, CE: cell, R1: resistor, R2: resistor, SW1: switch, SW2: switch, SW3: switch, SW4: switch, SW5: switch, SW6: switch, M1: transistor, M2: transistor, M3: transistor, M3$p$: transistor, M4: transistor, M5: transistor, M6: transistor, M6$p$: transistor, C1: capacitor, C2: capacitor, ND1: node, ND2: node, CMP1: comparator, CMP2: comparator, LCNA1: NAND circuit, LCNA2: NAND circuit, SI1: input terminal, SI2: input terminal, SO1: output terminal, SO2: output terminal, SO3: output terminal, IT: input terminal, RT1: reference potential input terminal, RT2: reference potential input terminal, OT: output terminal, OTB: output terminal, SHE: wiring, SHEB: wiring, VRHE: wiring, VRLE: wiring, GNDE: wiring, 100: semiconductor device, 100A: semiconductor device, 100B: semiconductor device, 100C: semiconductor device, 100D: semiconductor device, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503*a*: conductor, 503*b*: conductor, 505: conductor, 510: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 540: conductor, 540*a*: conductor, 540*b*: conductor, 542*a*: conductor, 542*b*: conductor, 543*a*: region, 543*b*: region, 544: insulator, 546: conductor, 548: conductor, 550: insulator, 560: conductor, 560*a*: conductor, 560*b*: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 621: conductor, 630: insulator, 631: insulator, 650: insulator, 651: insulator, 1400: secondary battery, 1401: positive electrode cap, 1402: battery can, 1403: substrate, 1404: control circuit, 1410: gasket, 1413: conductive plate, 1414: conductive plate, 1415: power storage system, 1416: wiring, 1420: control circuit, 1421: wiring, 1422: wiring, 1423: wiring, 1424: conductor, 1425: insulator, 1426: wiring, 1501: circuit board, 1509: label, 1511: terminal, 1513: secondary battery, 1515: sealant, 1517: antenna, 1519: layer, 1531: secondary battery pack, 1551: one, 1552: the other, 1590: control circuit, 1590*a*: circuit system, 1590*b*: circuit system, 1593: battery element, 1594: negative electrode, 1595: positive electrode, 1596: separator, 1601: positive electrode cap, 1602: battery can, 1603: positive electrode terminal, 1604: positive electrode, 1605: separator, 1606: negative electrode, 1607: negative electrode terminal, 1608: insulating plate, 1609: insulating plate, 1611: PTC element, 1613: safety valve mechanism, 4700: electronic component, 4701: lead, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5200: portable game machine, 5201: housing, 5202: display portion, 5203: button, 5300: laptop personal computer, 5301: housing, 5302: display portion, 5303: keyboard, 5304: pointing device, 5305: pointing device, 5400: ICD body, 5401: battery, 5402: wire, 5403: wire, 5404: antenna, 5405: subclavian vein, 5406: superior vena cava, 5407: memory device, 5500: information terminal, 5510: housing, 5511: display portion, 5700: automobile, 5900: wearable terminal, 5901: housing, 5902: display portion, 5903: operation button, 5904: operator, 5905: band, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 7500: stationary game machine, 7520: main body, 7522: controller This application is based on Japanese Patent Application Serial No. 2018-219250 filed on Nov. 22, 2018, the entire contents of which are hereby incorporated herein by reference.

The invention claimed is:

1. A power storage device comprising:
a circuit comprising a first input terminal and a second input terminal;
a hysteresis comparator comprising a first reference potential input terminal and a second reference potential input terminal; and
a cell configured to charge electricity,
wherein a positive electrode terminal of the cell is electrically connected to the second input terminal,
wherein a negative electrode terminal of the cell is electrically connected to the first input terminal,
wherein the circuit is configured to change a first reference potential of the first reference potential input terminal and a second reference potential of the second reference potential input terminal in accordance with a first potential input to the first input terminal,
wherein the circuit is configured to generate a third potential corresponding to the first potential of a negative electrode of the cell that is input to the first input terminal and a second potential of a positive electrode of the cell that is input to the second input terminal, and
wherein the third potential is input to an input terminal of the hysteresis comparator.

2. The power storage device according to claim 1,
wherein the circuit comprises a first switch, a second switch, a third switch, a fourth switch, a fifth switch, a sixth switch, a first resistor, a second resistor, a first capacitor, a second capacitor, and the second input terminal, wherein a first terminal of the first resistor is electrically connected to a first terminal of the second resistor and the input terminal of the hysteresis comparator, wherein a first terminal of the first switch is electrically connected to a first terminal of the first capacitor and the first reference potential input terminal, wherein a first terminal of the second switch is electrically connected to a second terminal of the first capacitor, wherein a first terminal of the third switch is electrically connected to the second terminal of the first capacitor, wherein a first terminal of the fourth switch is electrically connected to a first terminal of the second capacitor and the second reference potential input terminal, wherein a first terminal of the fifth switch is electrically connected to a second terminal of the second capacitor, wherein a first terminal of the sixth switch is electrically connected to the second terminal of the second capacitor, wherein the first input terminal is electrically connected to a second terminal of the third switch and a second terminal of the sixth switch, wherein the second input terminal is electrically connected to a second terminal of the first resistor, wherein the circuit is configured to retain the first reference potential in the first terminal of the first capacitor, wherein the circuit is configured to retain the second reference potential in the first terminal of the second capacitor, and wherein the circuit is configured to change the first reference potential retained in the first terminal of the first capacitor and the second reference potential retained in the first terminal of the second capacitor owing to capacitive coupling by input of the first potential to the first input terminal at the time when the first switch, the second switch, the fourth switch, and the fifth switch are each in an off state and the third switch and the sixth switch are each in an on state.

3. The power storage device according to claim 2, wherein at least one of the first switch, the second switch, the third switch, the fourth switch, the fifth switch, and the sixth switch comprises a transistor comprising a metal oxide in a channel formation region.

4. A power storage device comprising:
a circuit comprising a first input terminal, a second input terminal, a first potential retention portion, and a second potential retention portion; and
a cell configured to charge electricity,
wherein a negative electrode terminal of the cell is electrically connected to the first input terminal,
wherein a positive electrode terminal of the cell is electrically connected to the second input terminal,
wherein the circuit is configured to retain a first reference potential in the first potential retention portion, wherein the circuit is configured to retain a second reference potential in the second potential retention portion, and wherein the circuit is configured to change the first reference potential of the first potential retention portion and the second reference potential of the second potential retention portion, in accordance with a first potential of the negative electrode terminal of the cell that is input to the first input terminal.

5. The power storage device according to claim 4, wherein the circuit comprises a first switch, a second switch, a third switch, a fourth switch, a fifth switch, a sixth switch, a first resistor, a second resistor, a first capacitor, and a second capacitor, wherein a first terminal of the first resistor is electrically connected to a first terminal of the second resistor, wherein the first potential retention portion is electrically connected to a first terminal of the first switch and a first terminal of the first capacitor, wherein a first terminal of the second switch is electrically connected to a second terminal of the first capacitor, wherein a first terminal of the third switch is electrically connected to the second terminal of the first capacitor, wherein the second potential retention portion is electrically connected to a first terminal of the fourth switch and a first terminal of the second capacitor, wherein a first terminal of the fifth switch is electrically connected to a second terminal of the second capacitor, wherein a first terminal of the sixth switch is electrically connected to the second terminal of the second capacitor, wherein the first input terminal is electrically connected to a second terminal of the third switch and a second terminal of the sixth switch, wherein the second input terminal is electrically connected to a second terminal of the first resistor, and wherein the circuit is configured to change the first reference potential retained in the first potential retention portion and the second reference potential retained in the second potential retention portion owing to capacitive coupling by input of the first potential to the first input terminal at the time when the first switch, the second switch, the fourth switch, and the fifth switch are each in an off state and the third switch and the sixth switch are each in an on state.

6. The power storage device according to claim 5, wherein at least one of the first switch, the second switch, the third switch, the fourth switch, the fifth switch, and the sixth switch comprises a transistor comprising a metal oxide in a channel formation region.

7. An electronic device comprising the power storage device according to claim 1.

8. An electronic device comprising the power storage device according to claim 4.

* * * * *